(12) United States Patent
Shiino et al.

(10) Patent No.: US 9,390,800 B2
(45) Date of Patent: Jul. 12, 2016

(54) SEMICONDUCTOR MEMORY AND SEMICONDUCTOR MEMORY CONTROL METHOD

(71) Applicant: KABUSHIKI KAISHA TOSHIBA, Minato-ku, Tokyo (JP)

(72) Inventors: Yasuhiro Shiino, Fujisawa (JP); Eietsu Takahashi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 79 days.

(21) Appl. No.: 13/912,995

(22) Filed: Jun. 7, 2013

(65) Prior Publication Data

US 2013/0329495 A1 Dec. 12, 2013

(30) Foreign Application Priority Data

Jun. 7, 2012 (JP) ................. 2012-129977

(51) Int. Cl.
*G11C 16/04* (2006.01)
*G11C 11/56* (2006.01)
*G11C 16/34* (2006.01)

(52) U.S. Cl.
CPC ........ *G11C 16/0483* (2013.01); *G11C 11/5628* (2013.01); *G11C 11/5642* (2013.01); *G11C 16/3427* (2013.01)

(58) Field of Classification Search
CPC ........... G11C 11/5628; G11C 16/0483; G11C 16/3418; G11C 16/3427; G11C 2211/5621
USPC .............. 365/185.03, 185.02, 185.22, 185.17
See application file for complete search history.

(56) References Cited

U.S. PATENT DOCUMENTS

| | | | |
|---|---|---|---|
| 6,657,891 B1 | 12/2003 | Shibata et al. | |
| 7,898,864 B2 * | 3/2011 | Dong | G11C 11/5628 365/185.03 |
| 7,916,547 B2 | 3/2011 | Hosono | |

(Continued)

FOREIGN PATENT DOCUMENTS

| | | |
|---|---|---|
| JP | 2005243205 A | 9/2005 |
| JP | 2009070501 A | 4/2009 |

(Continued)

OTHER PUBLICATIONS

Japanese Office Action (and English translation thereof) dated Apr. 28, 2015, issued in counterpart Japanese Application No. 2012-129977.

(Continued)

*Primary Examiner* — Richard Elms
*Assistant Examiner* — Xiaochun L Chen
(74) *Attorney, Agent, or Firm* — Holtz, Holtz & Volek PC

(57) ABSTRACT

According to one embodiment, a semiconductor memory includes memory cells, word lines connected to gate of memory cells arranged in a row direction, a control circuit which controls the operation of the memory cells. During k-level data writing to a selected cell, the control circuit applies the corrected unselect voltage in accordance with the result of the reading of data from the unselected cell connected to the adjacent word line to the adjacent word line and applies a read voltage to the selected word line to read (k−1)-level data from the selected cell, and the control circuit writes data to the selected cell in accordance with the read (k−1)-level and the k-level data to be written.

17 Claims, 17 Drawing Sheets

(56) References Cited

U.S. PATENT DOCUMENTS

| | | |
|---|---|---|
| 2004/0213031 A1 | 10/2004 | Hosono et al. |
| 2005/0169057 A1 | 8/2005 | Shibata et al. |
| 2007/0206426 A1* | 9/2007 | Mokhlesi ............... 365/189.07 |
| 2009/0073763 A1* | 3/2009 | Hosono ................... 365/185.03 |
| 2009/0159949 A1* | 6/2009 | Maejima et al. ............. 257/314 |
| 2010/0037007 A1 | 2/2010 | Futatsuyama et al. |
| 2010/0146192 A1* | 6/2010 | Weingarten et al. ......... 711/103 |
| 2010/0208519 A1 | 8/2010 | Shiga et al. |
| 2010/0329010 A1* | 12/2010 | Dong ................ G11C 11/5628 365/185.17 |

FOREIGN PATENT DOCUMENTS

| | | |
|---|---|---|
| JP | 2009-522704 A | 6/2009 |
| JP | 2009-528651 A | 8/2009 |
| WO | WO 2007/079124 A1 | 7/2007 |
| WO | WO 2007/103038 A1 | 9/2007 |

OTHER PUBLICATIONS

Japanese Office Action (and English translation thereof) dated Jul. 21, 2015, issued in counterpart Japanese Application No. 2012-129977.

* cited by examiner

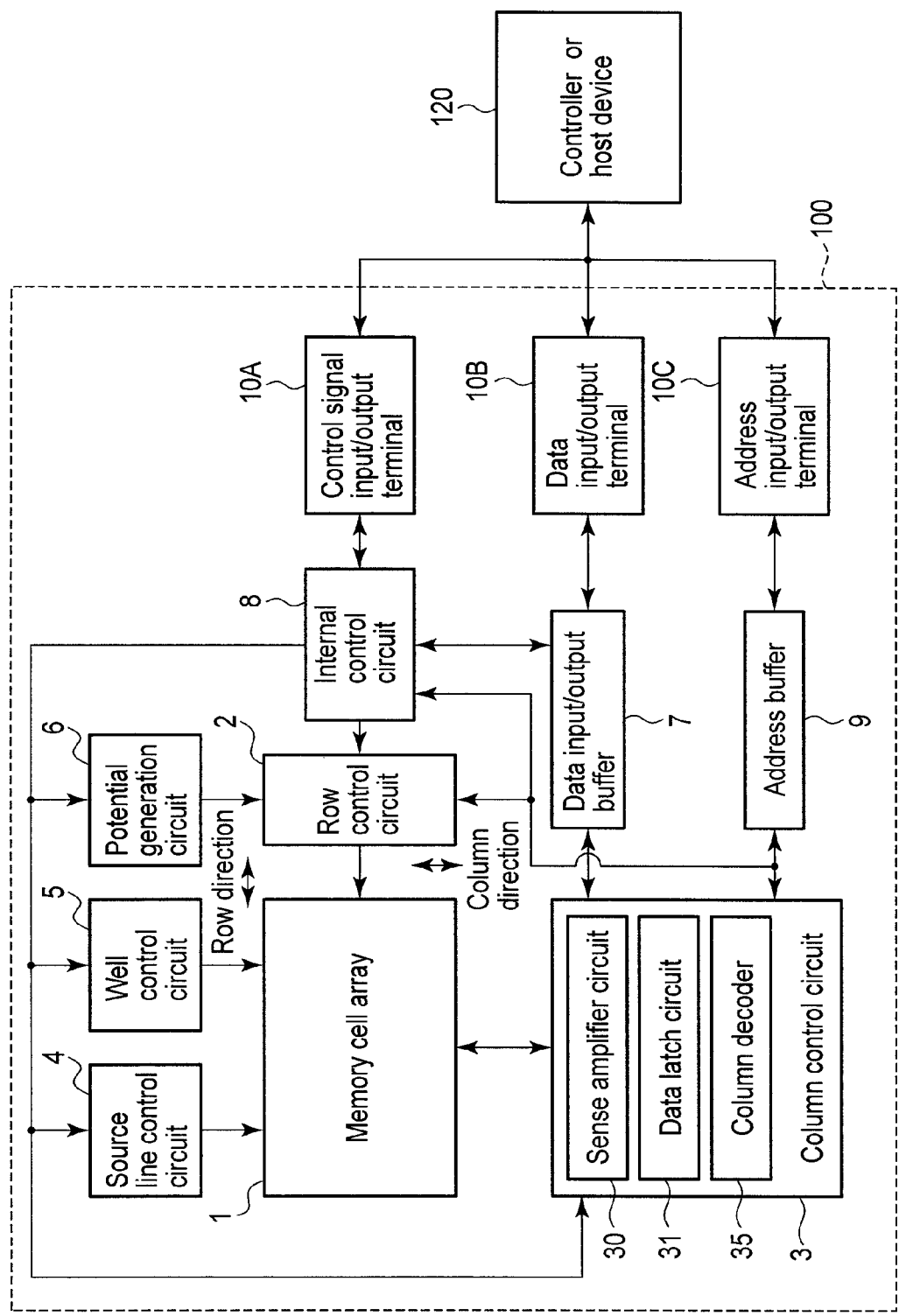
F I G. 1

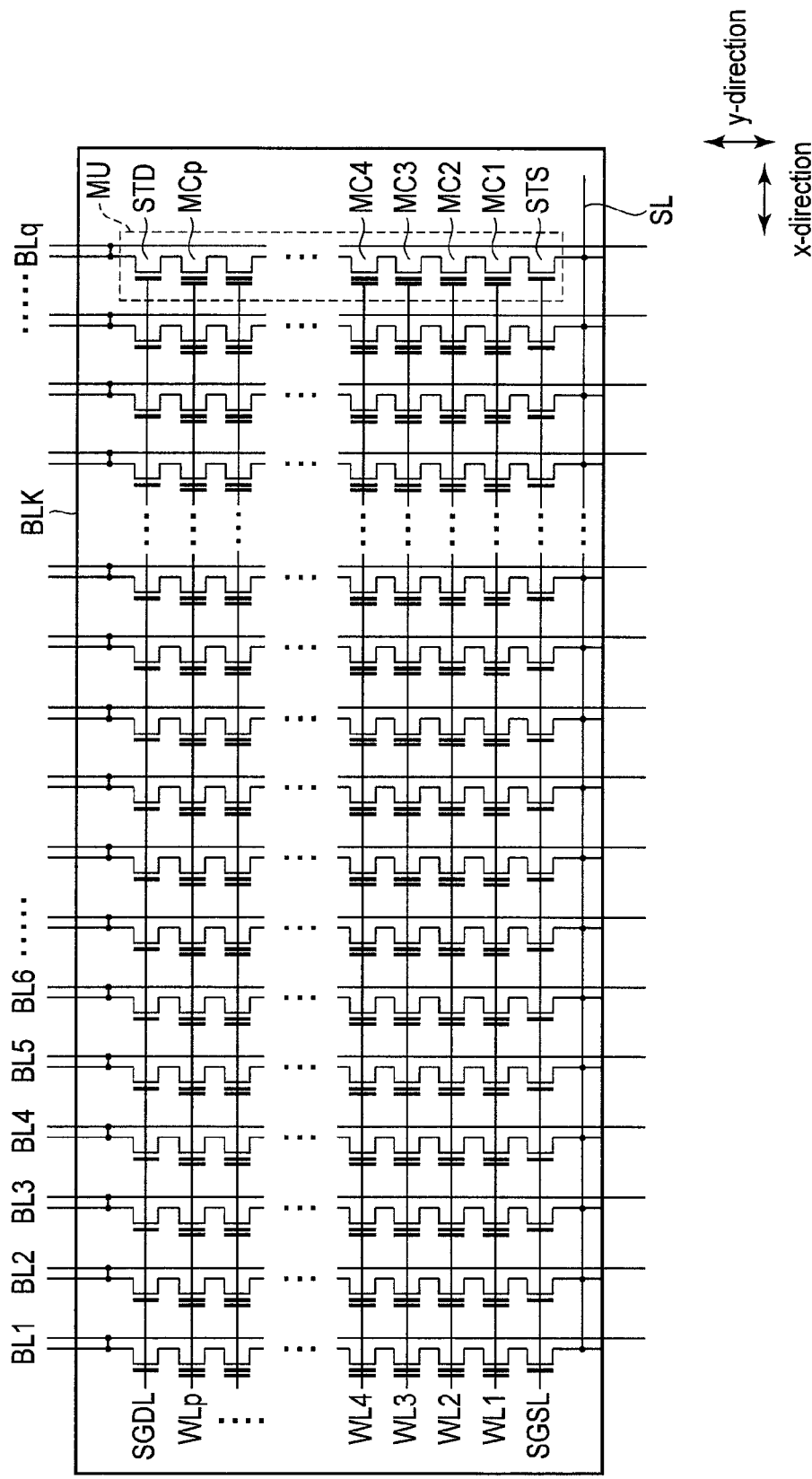
F I G. 2

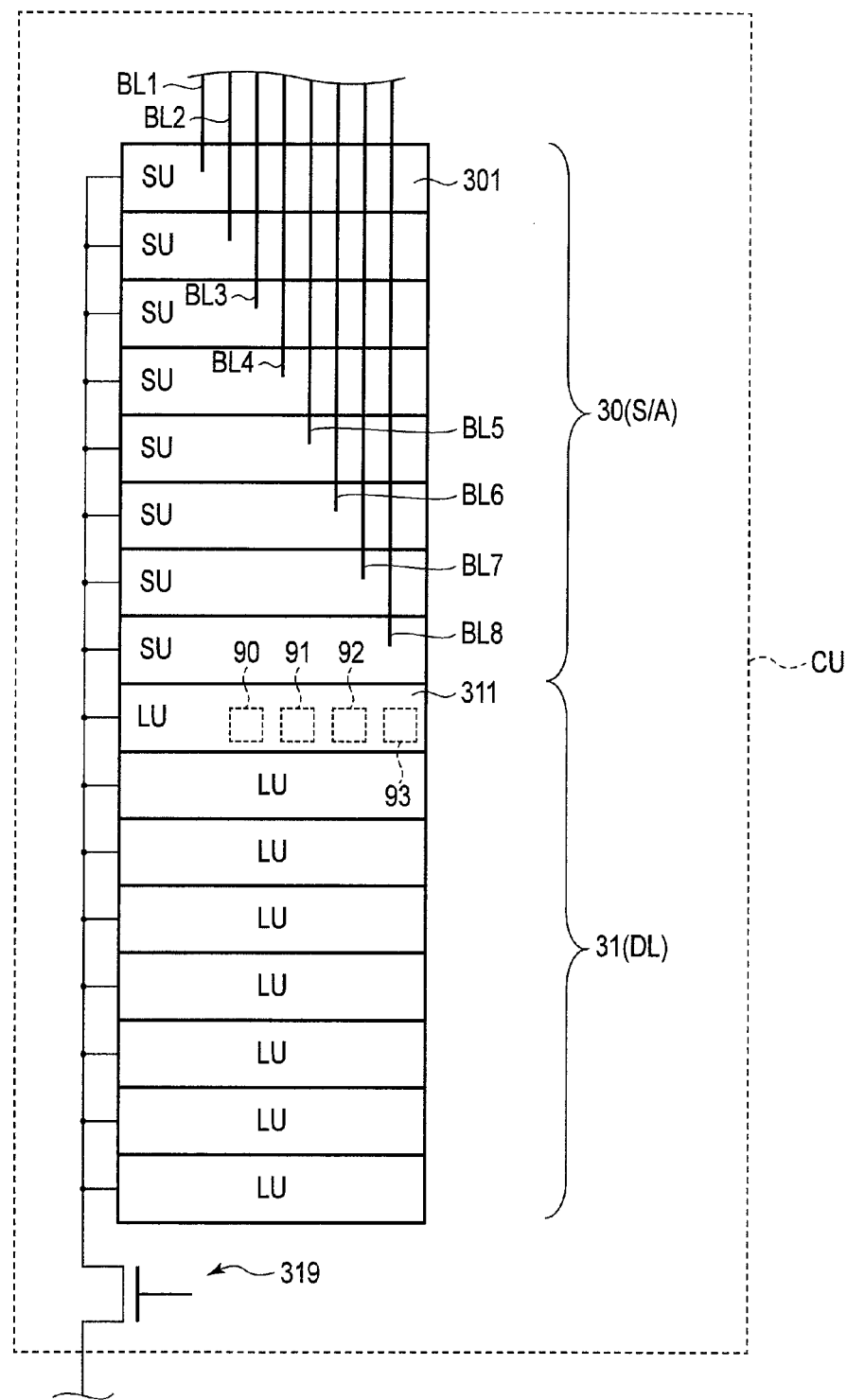
F I G. 3

|         | Lower | Upper |
|---------|-------|-------|
| WL<n+2> | 5     |       |
| WL<n+1> | 3     | 6     |
| WL<n>   | 1     | 4     |
| WL<n-1> |       | 2     |

|  | Lower | Upper |
|---|---|---|
| WL<n+1> | 5A | 6A |
| WL<n> | 3A | 4A |
| WL<n-1> | 1A | 2A |

F I G. 12

SEMICONDUCTOR MEMORY AND SEMICONDUCTOR MEMORY CONTROL METHOD

CROSS-REFERENCE TO RELATED APPLICATIONS

This application is based upon and claims the benefit of priority from Japanese Patent Application No. 2012-129977, filed Jun. 7, 2012, the entire contents of which are incorporated herein by reference.

FIELD

Embodiments described herein relate generally to a semiconductor memory.

BACKGROUND

Recently, flash memories have been used as primary storage devices in various electronic devices along with, for example, HDDs and CDs/DVDs.

For example, the increase of data input/output speed, the improvement of operation reliability, and the reduction of manufacturing costs are required for the flash memories.

BRIEF DESCRIPTION OF THE DRAWINGS

FIG. 1 is a block diagram showing an example of a circuit configuration of a semiconductor memory according to an embodiment;

FIG. 2 is an equivalent circuit diagram showing an example of the internal configuration of a memory cell array;

FIG. 3 is a diagram showing the internal configuration of a circuit located in the vicinity of the memory cell array;

FIGS. 10, 11A, 11B and 12 are diagrams illustrating modifications of the semiconductor memory according to the embodiment.

DETAILED DESCRIPTION

Figures 4, 5:
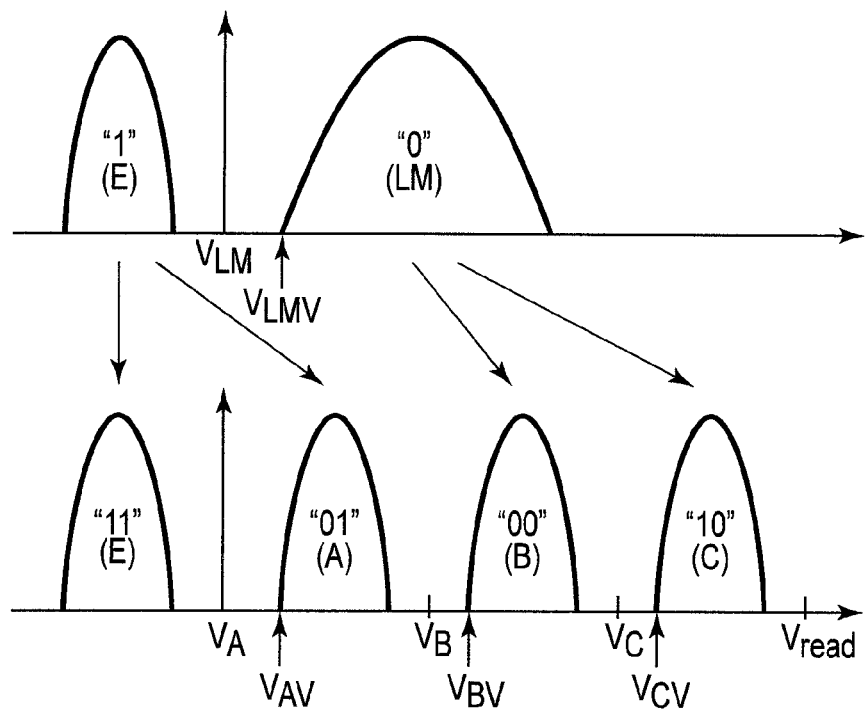
FIG. 4 is a graph showing an example of the correspondence between data and the thresholds of a memory cell.
FIG. 5 is a table illustrating an example of the operation of the semiconductor memory.

A semiconductor memory according to embodiments is described below in detail with reference to FIG. 1 to FIG. 12. Elements having the same function and configuration are provided with the same reference signs below, and repeated explanations are given when necessary.

In general, according to one embodiment, a semiconductor memory includes a plurality of memory cell units, each of the memory cell units including a plurality of memory cells to which a current path is connected in series and to which i-value (i is an integer of 2 or more) data is writable; a plurality of word lines, each of the word lines being connected to gates of the memory cells arranged in a row direction among the memory cells; a source line connected to one end of the memory cell units; a plurality of bit lines each connected to the other end of the memory cell units; and a control circuit which controls an operation of the memory cell units, wherein during writing to selected cells connected to a selected word line which is selected as a write target of first k-level data (k is an integer of 2 or more) among the word lines, in at least one unselected adjacent word line adjacent to the selected word line, the control circuit applies an unselect voltage corrected in accordance with result of reading of data from unselected cells connected to the adjacent word line to the adjacent word line and applies a read voltage to the selected word line to read first (k−1)-level data from the selected cells, and the control circuit writes data to the selected cells in accordance with the read first (k−1)-level data and the first k-level data to be written.

(1) First Embodiment

A semiconductor memory according to the first embodiment is described with reference to FIG. 1 to FIG. 7E.

(a) Configuration

The configuration and function of the semiconductor memory according to the embodiment are described with reference to FIG. 1 to FIG. 7E.

FIG. 1 is a block diagram showing the major components in the configuration of the semiconductor memory according to the present embodiment. The semiconductor memory according to the present embodiment is, for example, a nonvolatile semiconductor memory, and more specifically, a flash memory by way of example.

A flash memory 100 according to the present embodiment receives a signal supplied from an external device such as a memory controller 120 or host device 120 provided outside a chip of the flash memory 100, and sends a signal to the memory controller 120 or host device 120. Between the flash memory 100 and the memory controller 120 or host device 120, a control signal (command or status) is input/output via a control signal input/output terminal 10A, data is input/output via a data input/output terminal 10B, and an address signal is input/output via an address signal input/output terminal 10C. A memory system is formed by the flash memory 100 according to the present embodiment and memory controller 120.

The flash memory 100 according to the present embodiment includes a memory cell array 1 to store data. The memory cell array 1 has a plurality of memory cells.

When the flash memory shown in FIG. 1 is, for example, a NAND-type flash memory, the memory cell array 1 has a plurality of blocks. A block BLK indicates the minimum unit of erasure.

Here, FIG. 2 is used in addition to FIG. 1 to describe the internal configuration of the memory cell array 1. FIG. 2 is an equivalent circuit diagram showing the circuit configuration of one block BLK.

In the NAND-type flash memory, one block BLK is formed by a plurality of memory cell units (hereinafter also referred to as NAND cell units) MU arranged in an x-direction (first direction, row direction). For example, q memory cell units MU are provided in one block BLK.

One memory cell unit MU includes a memory cell string constituted by a plurality of (e.g. p) memory cells MC1 to MCp, a first select transistor STS (hereinafter referred to as a source-side select transistor) connected to one end of the memory cell string, and a second select transistor STD (hereinafter referred to as a drain-side select transistor) connected to the other end of the memory cell string. In the memory cell string, current paths of the memory cells MC1 to MCp are connected in series along a y-direction (second direction, column direction).

A source line SL is connected to one end (source side) of the memory cell unit MU, more specifically, one end of a current path of the source-side select transistor STS. A bit line BL is connected to the other end (drain side) of the memory cell unit MU, that is, one end of a current path of the drain-side select transistor STD.

The number of memory cells that constitute one memory cell unit MU has only to be two or more, and may be, for example, 16, 32, or 64 or more. Hereinafter, the memory cells MC1 to MCp are represented by memory cells MC when not distinguished from one another.

The memory cell MC is a field effect transistor having a charge storage layer (e.g. a floating gate electrode, or an insulating film including a trap level). The source/drain of two memory cells MC adjacent in the y-direction are connected to each other. Thus, the current paths of the memory cells MC are connected in series, and the memory cell string is formed.

The drain of the source-side select transistor STS is connected to the source of the memory cell MC1. The source of the source-side select transistor STS is connected to the source line SL. The source of the drain-side select transistor STD is connected to the drain of the memory cell MCp. The drain of the drain-side select transistor STD is connected to one of a plurality of bit lines BL1 to BLq. The number of bit lines BL1 to BLq is the same as the number of the memory cell units MU in the block BLK.

Word lines WL1 to WLp extend in the x-direction, and each of word lines WL1 to WLp is connected in common to the gates of the memory cells MC arranged along the x-direction. In one memory cell unit MU, the number of the word lines is the same as the number of the memory cells constituting one memory cell string.

A drain-side select gate line SGDL extends in the x-direction, and is shared by and connected to the gates of the drain-side select transistors STD arranged along the x-direction. A source-side select gate line SGSL extends in the x-direction, and is shared by and connected to the gates of the source-side select transistors STS arranged along the x-direction.

For example, a dummy word line (not shown) is provided between the source-side select gate line SGSL and word line WL1 located closest to the source line side. And also, the other dummy word line (not shown) is provided between the drain-side select gate line SGDL and word line WLp located closest to bit line side. A plurality of dummy cells may be connected to the dummy word lines. The dummy cell has the same structure as that of the memory cell. However, the dummy cell is not used to store external data.

Hereinafter, bit lines BL1 to BLq are represented by bit lines BL when not distinguished from one another, and word lines WL1 to WLp are represented by word lines WL when not distinguished from one another.

A row control circuit 2 controls rows of the memory cell array 1. The row control circuit 2 is connected to the word lines WL and the select gate lines SGDL and SGSL that are provided in the memory cell array 1. The row control circuit 2 has a row decoder and a driver. The row control circuit 2 selects a block BLK and a page PG on the basis of an address signal transferred from an address buffer 9, and controls the operations (potentials) of the word lines WL and the select gate lines SGDL and SGSL.

A source line control circuit 4 controls the potential of the source line SL connected to the memory cell unit MU. A well control circuit 5 controls the potential of a well region in the memory cell array 1.

A potential generation circuit 6 generates a write voltage, a read voltage (determination voltage), and an unselect potential (a write pass voltage and a read pass voltage) applied to each of the word lines WL in data writing (programming), in data reading, and in erasing. The potential generation circuit 6 also generates, for example, potentials applied to the select gate lines SGDL and SGSL. The potentials generated by the potential generation circuit 6 are input to the row control circuit 2, and respectively applied to a selected word line, unselected word lines, and the select gate line. The potential generation circuit 6 generates a potential applied to the source line SL and a potential applied to the well region. The potential generation circuit 6 transfers the generated potentials to the source line control circuit 4 and the well control circuit 5.

A data input/output buffer 7 serves as a data input/output interface. The data input/output buffer 7 temporarily holds external data input via the data input/output terminal 10B, and outputs the held data to the memory cell array 1 in accordance with a predetermined timing. The data input/output buffer 7 temporarily holds data output from the memory cell array 1, and outputs the held data to the data input/output terminal 10B in accordance with a predetermined timing.

The address buffer 9 temporarily holds an address signal input via the address signal input/output terminal 10C. The external address signal indicates a physical address, and includes a physical row address and a physical column address.

An internal control circuit (also referred to as a state machine or a sequencer) 8 manages the operation of the overall flash memory. The internal control circuit 8 receives a control signal (command) input from the control signal input/output terminal 10A. This control signal is output from, for example, the memory controller 120 or host device 120. For example, the internal control circuit 8 includes a command interface. For example, the internal control circuit 8 sends a control signal (status) indicating the operation status inside the flash memory 100 to the memory controller 120 or host device 120 via the control signal input/output terminal 10A. As a result, the operation status of the flash memory 100 is reported to the memory controller 120 or host device 120 outside the flash memory 100.

A column control circuit 3 controls a column of the memory cell array 1. The column control circuit 3 includes a sense amplifier circuit 30, a data latch circuit 31, and a column decoder 35.

The sense amplifier circuit 30 is connected to the bit lines BL provided in the memory cell array 1. In data reading (in the output of data from the memory cell array 1), the sense amplifier circuit 30 detects and amplifies a potential variation of the bit line BL, and determines the data stored in the memory cell MC. In data writing (in the input of data to the memory cell array), the sense amplifier circuit 30 charges or discharges the bit line BL.

The data latch circuit 31 temporarily stores data read from the memory cell array 1 and data to be written to the memory cell array 1.

The column decoder 35 selects and activates a control unit set for the column of the memory cell array 1.

FIG. 3 is a schematic diagram illustrating the connection of the bit lines in the memory cell array 1, sense units in the sense amplifier circuit 30, and latch units in the data latch circuit 31.

As shown in FIG. 3, the sense amplifier circuit 30 includes a plurality of sense amplifier units 301. One sense amplifier unit 301 is connected to, for example, one bit line BL. In data writing, the sense amplifier unit 301 charges or discharges a predetermined bit line BL under the control of the sense amplifier circuit 30 and the internal control circuit 8. In data reading, the sense amplifier unit 301 amplifies and detects a potential variation of a predetermined bit line BL. The sense amplifier unit 301 may also function as a latch (buffer).

Depending on the method of sensing the bit line BL, one sense amplifier unit 301 may be shared by an even bit line and an odd bit line adjacent to each other. When the sense amplifier unit 301 is shared by two bit lines, the even and odd bit lines that share the sense amplifier unit 301 are connected to the sense amplifier unit 301 in accordance with different timings depending on the operation.

The data latch circuit 31 includes a plurality of latch units 311. One latch unit 311 is connected to one bit line BL via the sense amplifier unit 301 (sense amplifier circuit 30). The latch unit 311 temporarily holds, for example, data to be written to the memory cell, data read from the memory cell, and setting information (flag) indicating the operation for the memory cell. The latch unit 311 also has a function for amplifying a signal from the sense amplifier unit 301 or an external signal.

The latch unit 311 includes a plurality of latches. When, for example, the memory cell MC stores 2-bit data, the latch unit 311 includes a lower data latch 90 for holding low 1-bit data, and an upper data latch 91 for holding high 1-bit data. For example, the latch unit 311 may further include a cache reading latch 92, and a latch 93 for holding a flag that indicates an operation mode or verification results or failure bit judgments.

For example, eight bit lines (eight memory cell units) BL1 to BL8, and eight sense units 301 and eight latch units 311 corresponding to bit lines BL1 to BL8 constitute one control unit CU. The control unit constituted by eight bit lines, eight sense units, and eight latch units is hereinafter referred to as a column unit CU. In this case, one column unit CU in one page of data corresponds to eight bits (one byte). However, the number of the bit lines BL included in one column unit CU (also referred to as COL), the number of the sense units 301, and the number of the latch units 311 are not limited to eight.

Each column unit CU is connected to the column decoder 35 and a data bus via a field effect transistor 319 as a selection switch of the column units CU. The selection switch 319 used to select and activate each column unit CU is hereinafter also referred to as a column selection switch 319.

Each of the memory cells MC stores external data by associating the intensity of a threshold voltage of the transistor (the distribution of the threshold voltage) with the data.

Each of the memory cells MC stores data having two values (1 bit) or four values (2 bits) or more. For example, the memory cell MC in which two-value data is stored is referred to as a two-value memory (or SLC), and the memory cell MC storing data having four values (2 bits) or more is referred to as a multivalue memory (multilevel memory or MLC). Thus, data having an i-level (i is an integer of 2 or more) can be written to the memory cell MC.

Data is collectively written to or read from the memory cells MC connected to the same word line WL. A control unit of data writing/reading is referred to as a page PG.

Data in the multivalue memory is written or read per lower bit or per upper bit. Therefore, when the memory cell MC holds 2-bit data, two pages PG are allocated to one word line WL. A page collectively written or read per lower bit is hereinafter referred to as a lower page. A page collectively written or read per upper bit is hereinafter referred to as an upper page.

In order to inhibit mutual interference (e.g. adjacent interference effect) between adjacent word lines and between adjacent memory cells during the writing of data to the multivalue memory, a writing method that gives special consideration to the allocation of a threshold voltage of the memory cell and data and the order of page writing is used. For example, a lower at middle (LM) mode is known as one writing method of the flash memory.

The LM mode for use in the flash memory according to the present embodiment is described with reference to FIG. 4 and FIG. 5.

FIG. 4 is a graph showing an example of the correspondence between 4-value data and the distributions of a plurality of threshold voltages set for the memory cell.

As shown in FIG. 4, 1-bit ("1" or "0") lower data (lower bit) is allocated to two threshold distributions.

The lower data "1" is allocated to threshold distributions corresponding to an erased state ("E" state). The lower data "1" indicates the initial state (state before writing) of the memory cell MC. For example, the memory cell MC in the erased state has a negative threshold voltage.

When data is written in the memory cell MC, the threshold of the memory cell MC is shifted from the erased state to the threshold distribution to which the data "0" is allocated. When the threshold voltage of the memory cell MC is a threshold voltage corresponding to the data "0" (is within the threshold distribution), this state is hereinafter referred to as an LM state.

1-bit ("1" or "0") upper data (upper bit) is written to the memory cell MC by the shift of the threshold of the memory cell MC in which the lower data is written.

When the upper data and the lower data are written in the memory cell MC, 2-bit ("11", "01", "00", and "10") lower data and upper data are respectively allocated to four threshold distributions.

When the upper data "1" is written in the memory cell MC of the lower data "1", the upper/lower data "11" is allocated to the threshold distribution of the memory cell MC in the erased state (E-state).

When the upper data "0" is written in the memory cell MC of the lower data "1", the threshold voltage of the memory cell MC in the erased state is shifted to the threshold distribution of an A-state to which the upper/lower data "01" is allocated.

When the upper data "0" is written in the memory cell MC of the lower data "0", the threshold voltage of the memory cell MC in the LM state is shifted to the threshold distribution of a B-state to which the upper/lower data "00" is allocated.

When the upper data "1" is written in the memory cell MC of the lower data "0", the threshold voltage of the memory cell MC in the LM state is shifted to the threshold distribution of a C-state to which the upper/lower data "10" is allocated.

The threshold distribution in the LM state is set within a range between the threshold distribution to which "01" is allocated and the threshold distribution to which "00" is allocated. The threshold distribution in the LM state can be said to be a rough write state wider than the range of the threshold distribution to which "01" is allocated and the range of the threshold distribution to which "00" is allocated.

Thus, when 1-bit data is stored in the memory cell MC capable of storing 2-bit data, the memory cell MC stores the 1-bit data as lower data. When 2-bit data is stored in the memory cell MC capable of storing 2-bit data, upper data can be written to the memory cell MC after lower data has been written to the memory cell MC.

The threshold state of the memory cell MC is determined (read) by the use of determination voltages $V_A$, $V_B$, and $V_C$ that are set between the threshold distributions. For example, when the determination voltage $V_A$ is applied to the gates of the memory cells MC, the memory cell MC at the E-state is turned on, and the memory cells MC at the A-, B-, and C-states are turned off. As a result, the memory cell MC at the E-state can be determined. When the determination voltage $V_B$ is applied to the gates of the memory cells MC, the memory cells MC at the E- and A-states are turned on, and the memory cells MC at the B- and C-states are turned off. It can be determined by the two determination voltages $V_A$ and $V_B$ that the memory cell MC which has turned off during the application of the determination voltage $V_A$ and which has turned on during the application of the determination voltage $V_B$ is the memory cell MC at the A-state. In the same manner, the memory cell MC at the B-state can be determined by the use of the determination voltage $V_B$ and the determination voltage $V_C$. The memory cell MC which has not turned on by the determination voltage $V_C$ is the memory cell MC at the C-state.

A determination voltage (hereinafter also referred to as an LM read voltage) $V_{LM}$ is used to determine whether the threshold state of the memory cell MC is the erased state or the LM state. For example, the value (level) of the determination voltage $V_{LM}$ used to determine the LM state is set to a value equal to or less than the determination voltage $V_B$ to determine the B-state.

For example, a verify voltage to determine whether predetermined data has been written during write verify is set at the lower limit value of each threshold distribution. For example, as shown in FIG. 4, verify voltages $V_{LMV}$, $V_{AV}$, $V_{BV}$, and $V_{CV}$ are provided for the four threshold distributions, respectively.

For example, in the reading of data outside the flash memory, a flag indicating the LM mode can be used to determine whether the data stored in the memory cell MC are lower data alone or both lower and upper data.

FIG. 5 is a table illustrating an example of the order of writing lower and higher data to each page in the LM mode.

In FIG. 5, a page allocated to word line WLn among the word lines WL is selected as a page to which to write lower data, and the lower data is written to the memory cell MC connected to word line WLn (writing order <1>). Then a page of word line WL(n−1) adjacent to word line WLn on the source line side (the source side of the memory cell unit) is selected as a write target. For example, lower data has already been written in the memory cell MC connected to word line WL(n−1), and upper data is written to the memory cell MC connected to word line WL(n−1) (writing order <2>).

Then word line WLn is not selected, and a page of word line WL(n+1) adjacent to word line WLn on the bit line side (the drain side of the memory cell unit) is selected as a write target page. Lower data is written to the memory cell MC connected to word line WL(n+1) (writing order <3>).

After word line WL(n+1) is selected to write the lower data, word line WLn is selected, and upper data is written to the memory cell MC connected to word line WLn (writing order <4>). Thus, the lower data and the upper data are written to the pages corresponding to word line WLn in nonconsecutive order.

After the lower and upper data have been written to the two pages allocated to word line WLn, lower data is written to the memory cell MC connected to word line WL(n+2) (writing order <5>). After the lower data has been written to the memory cell MC connected to word line WL(n+2), upper data is written to the memory cell MC connected to word line WL(n+1) (writing order <6>).

In the reading of data in the flash memory based on an external command, the word lines (pages) are sequentially selected for reading in the pages of the word lines in substantially the same order as that in the writing of the lower and upper data.

In the writing of data in the LM mode, multivalue (multilevel) data is written to the memory cell MC connected to each word line in the order (address) shown in FIG. 5, so that the adjacent interference effect between the adjacent memory cells MC is decreased.

Hereinafter, word line WLn is treated as a selected word line, and unselected word line WL(n−1) adjacent to the source line side of word line WLn is indicated by a source line side adjacent word line WL(n−1), while unselected word line WL(n+1) adjacent to the bit line side of word line WLn is indicated by a bit line side adjacent word line WL(n+1). The memory cell (unselected cell) MC connected to the adjacent word line is referred to as an adjacent cell.

In the write sequence of upper data, before the write voltage to write upper data is applied to the selected word line WL (before the threshold of the memory cell is shifted to a value corresponding to the upper data), external data (upper data) to be written to an upper page is loaded into the data latch 311, and lower data stored in the lower page of word line WLn selected as a target for upper data writing is loaded (read) into the data latch 311.

It is decided, by the calculation results of the loaded upper data and lower data, into which threshold distribution to shift the threshold voltage of the memory cell MC connected to word line WLn.

The operation of loading the lower data inside the flash memory during the writing of upper data is hereinafter referred to as lower data reading or LM reading. The determination voltage $V_{LM}$ is used to read lower data from the memory cell which only stores lower data.

In the present embodiment, data in the page allocated to the word line (adjacent word line) adjacent to word line WLn is read in advance of the loading of lower data in the write sequence of upper data. The operation of reading in advance (previously reading) data in the page allocated to the adjacent word line (the memory cell connected to the adjacent word line) before the loading of lower data in the sequence of writing upper data to the selected word line is hereinafter referred to as previous reading or LM direct look ahead (DLA).

Figure 6:
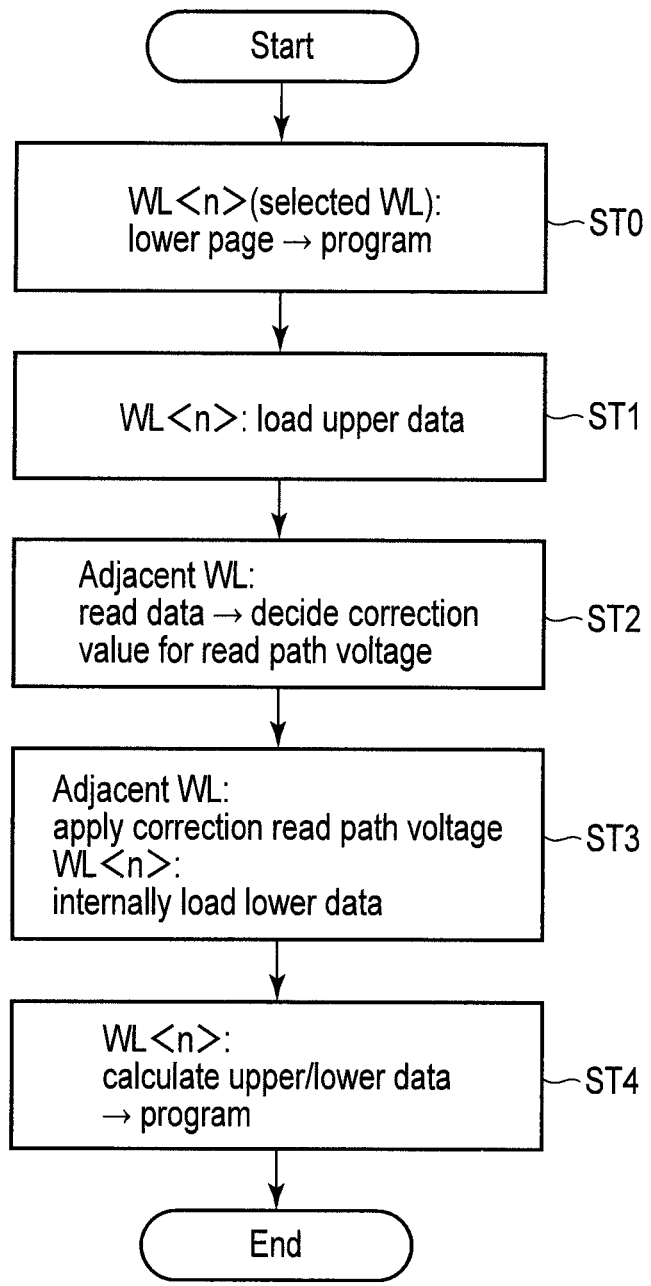
FIG. 6 is a flowchart showing an operational example of the semiconductor memory according to the embodiment.
Figure 7A:
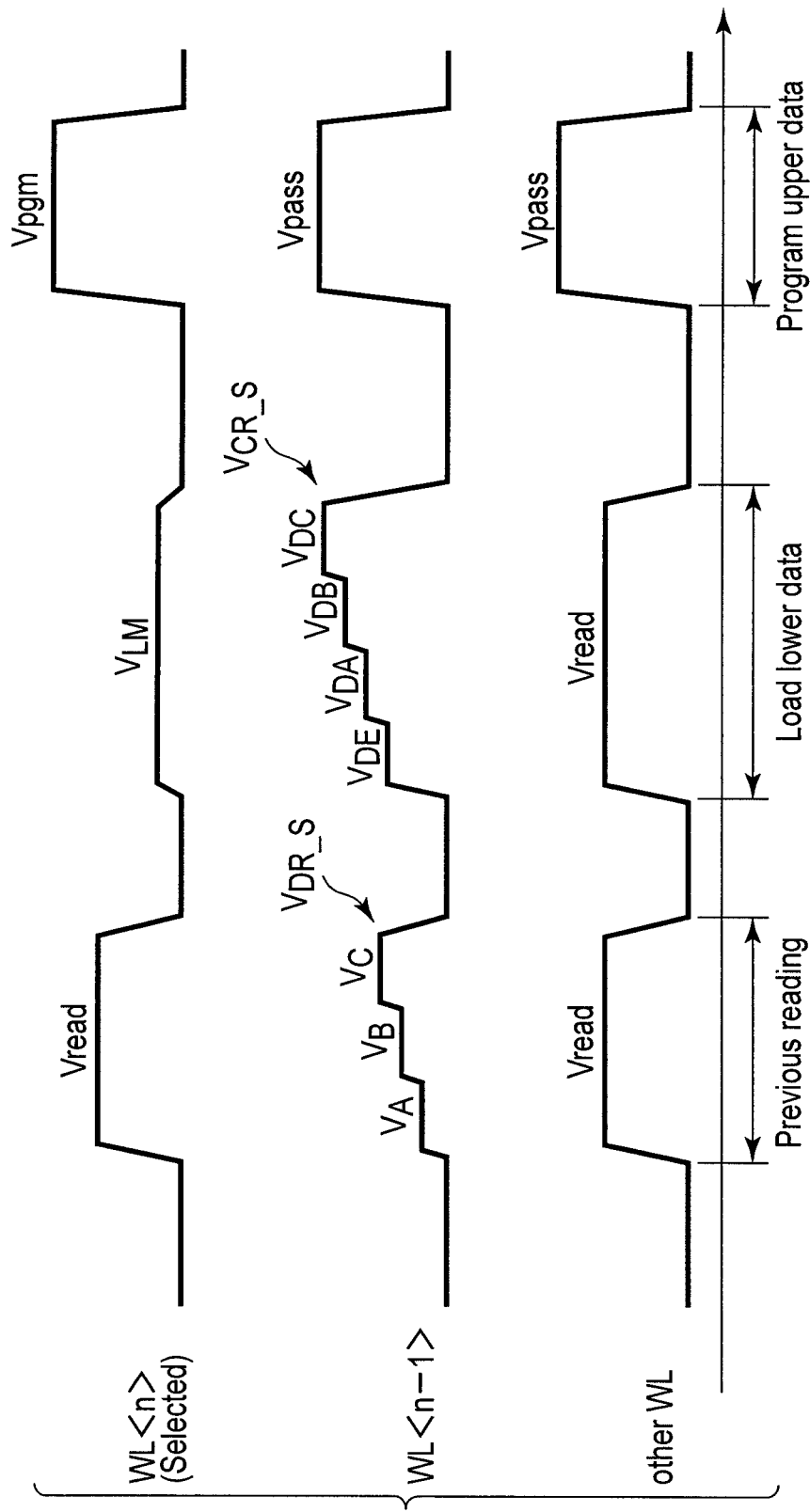
FIGS. 7A, 7B, 7C, 7D and 7E are waveform charts illustrating an operational example of a semiconductor memory according to a first embodiment.

As shown in FIG. 6 and FIG. 7A described later, in the write sequence of upper data, under the control of the internal control circuit 8, the flash memory 100 according to the first embodiment previously reads in the memory cells MC of word line WL(n−1) adjacent to the source line side of the selected word line WLn before reading lower data from the memory cells MC of selected word line WLn to which to write upper data.

Suppose that upper data has been written to source line side adjacent word line WL(n−1) during the writing of upper data to the page of word line WLn. In some cases, upper data is not written to the memory cell MC of source line side adjacent word line WL(n−1), and lower data alone is written to the memory cells MC of source line side adjacent word line WL(n−1), during the writing of upper data to the memory cell MC of word line WLn. In this case, in the LM-reading in the selected cells connected to the selected word line WLn, the influence of the threshold voltage of the memory cell MC connected to source line side adjacent word line WL(n−1) to the selected cell MC is small. For example, the memory cells MC1 connected to the word line WL1 located closest to source line side are used as the two-value memory (SLC) without storing the upper data. When the dummy word lines adjacent to select gate lines are provided in the memory cell array 1 as described above, dummy word lines are excluded from the word lines located closest to source line side and to bit line side. That is, the word line WL1 located closest to source line side is word line adjacent to the dummy word line on the source-side select gate line SGSL side, and the word line WLp located closest to bit line side is word line adjacent to the dummy word line on the drain-side select gate line SGDL side.

Here, in the present embodiment, the determination voltages $V_A$, $V_B$, and $V_C$ are used to previously read in the page (memory cell) of source line side adjacent word line WL(n−1). A read voltage (previous read voltage) $V_{DR\_S}$ used to previously read in source line side adjacent word line WL(n−1) is a stepped voltage pulse including the voltage values of the determination voltages $V_A$, $V_B$, and $V_C$.

As a result, the data write state (threshold voltage state) of each memory cell MC connected to source line side adjacent word line WL(n−1) is determined.

In accordance with the result of the previous reading, a correction value that takes into consideration the mutual interference between the adjacent memory cells is calculated and set by the control circuit 8 on the basis of advance simulation results or die sort test results, regarding the read pass voltage (unselect voltage) applied to source line side adjacent word line WL(n−1) during the reading of lower data in a selected cell. This correction value can be stored in a management region of the nonvolatile semiconductor memory or in the controller 120 or in the host device 120. This correction value is reflected in the read pass voltage applied to source line side adjacent word line WL(n−1) during the reading of lower data in the selected cell.

When lower data is loaded from the page of selected word line WLn in the write sequence of upper data, a read pass voltage corrected by the result of the previous reading (hereinafter referred to as a correction read pass voltage) $V_{CR\_S}$ is applied to source line side adjacent word line WL(n−1) under the control of the internal control circuit 8.

In the present embodiment, one or more latches for the previous reading or the LM reading may be added to the above-mentioned latch unit 311. Alternatively, data internally read by the previous reading or the LM reading may be stored in the existing latch in the latch unit 311.

The flash memory 100 according to the present embodiment reads lower data from the memory cell MC connected to the selected word line under the control of the internal control circuit 8 while the correction read pass voltage is being applied to the adjacent word line. The reading of lower data from the memory cell MC connected to the selected word line during the application of the correction read pass voltage to the adjacent word line is hereinafter also referred to as correction reading.

For example, as has been described with reference to FIG. 5, during the writing of upper data to the memory cell MC of word line WLn, the threshold state (threshold voltage) of each memory cell MC is one of the four threshold states (threshold distributions) in the memory cells MC of source line side adjacent word line WL(n−1) when lower and upper data have been written to the memory cells MC of source line side adjacent word line WL(n−1).

Therefore, as shown in the waveform chart of the voltage applied to the word lines during data writing in the flash memory in FIG. 7A, a voltage pulse including four voltage values $V_{DE}$, $V_{DA}$, $V_{DB}$, and $V_{DC}$ is applied as the correction read pass voltage $V_{CR\_S}$ to source line side adjacent word line WL(n−1) by the internal control circuit 8 during the LM-reading in the memory cell MC of word line WLn (reading of lower data). The correction read pass voltage $V_{CR\_S}$ applied to source line side adjacent word line WL(n−1) is hereinafter also referred to as a source line side read pass voltage $V_{CR\_S}$.

The voltage values $V_{DE}$, $V_{DA}$, $V_{DB}$, and $V_{DC}$ of the correction read pass voltage $V_{CR\_S}$ correspond to values obtained by subtracting the correction value corresponding to each state from a read unselect voltage (read pass voltage) Vread, or a value obtained by adding the correction value to the read pass voltage Vread.

The voltage value $V_{DE}$ of the correction read pass voltage $V_{CR\_S}$ includes a correction value for the memory cell MC at the E-state, and is, for example, lower than the voltage value of the uncorrected read pass voltage Vread. The voltage value $V_{DA}$ of the correction read pass voltage $V_{CR\_S}$ includes a correction value for the memory cell MC at the A-state, and is, for example, lower than the voltage value of the read pass voltage Vread. For example, the voltage value $V_{DB}$ of the correction read pass voltage $V_{CR\_S}$ includes a correction value for the memory cell MC at the B-state, and is, for example, higher than the voltage value of the read pass voltage Vread. For example, the voltage value $V_{DC}$ of the correction read pass voltage $V_{CR\_S}$ includes a correction value for the memory cell MC at the C-state, and is, for example, higher than the voltage value of the read pass voltage Vread. One of the voltage values $V_{DE}$, $V_{DA}$, $V_{DB}$, and $V_{DC}$ may be as high as the read pass voltage Vread.

Figure 7B:
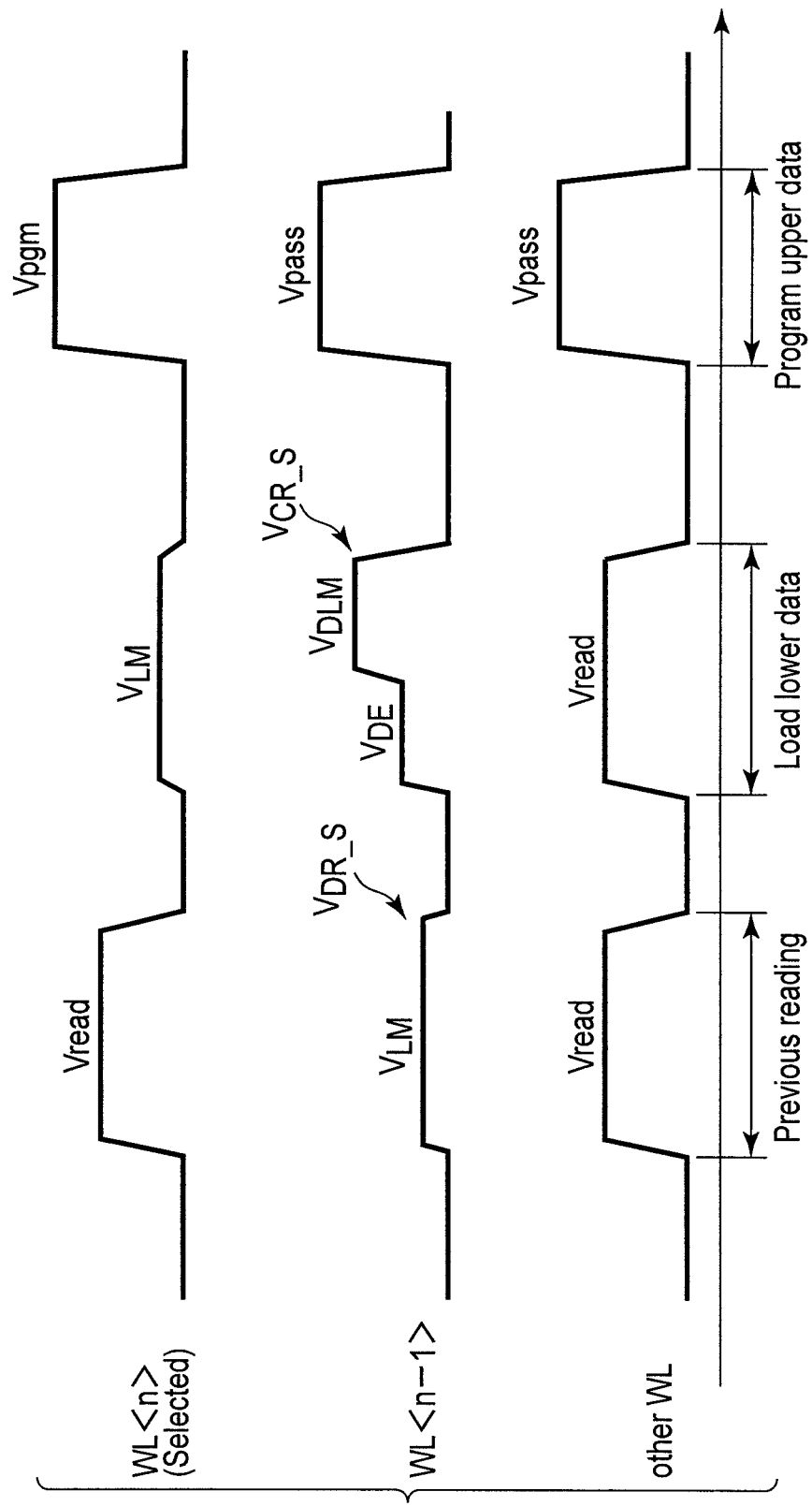
Figure 7C:
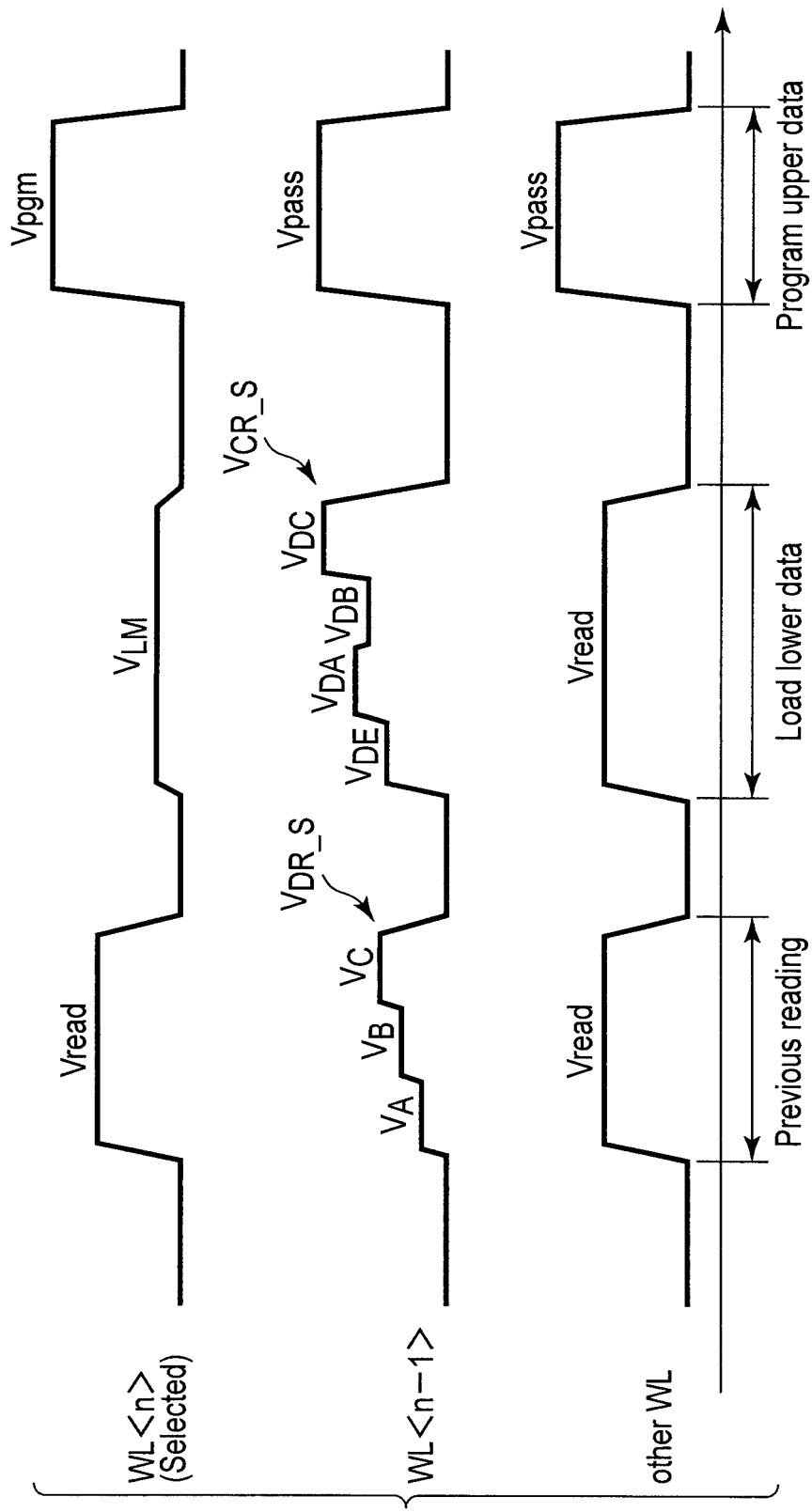
Figure 7D:
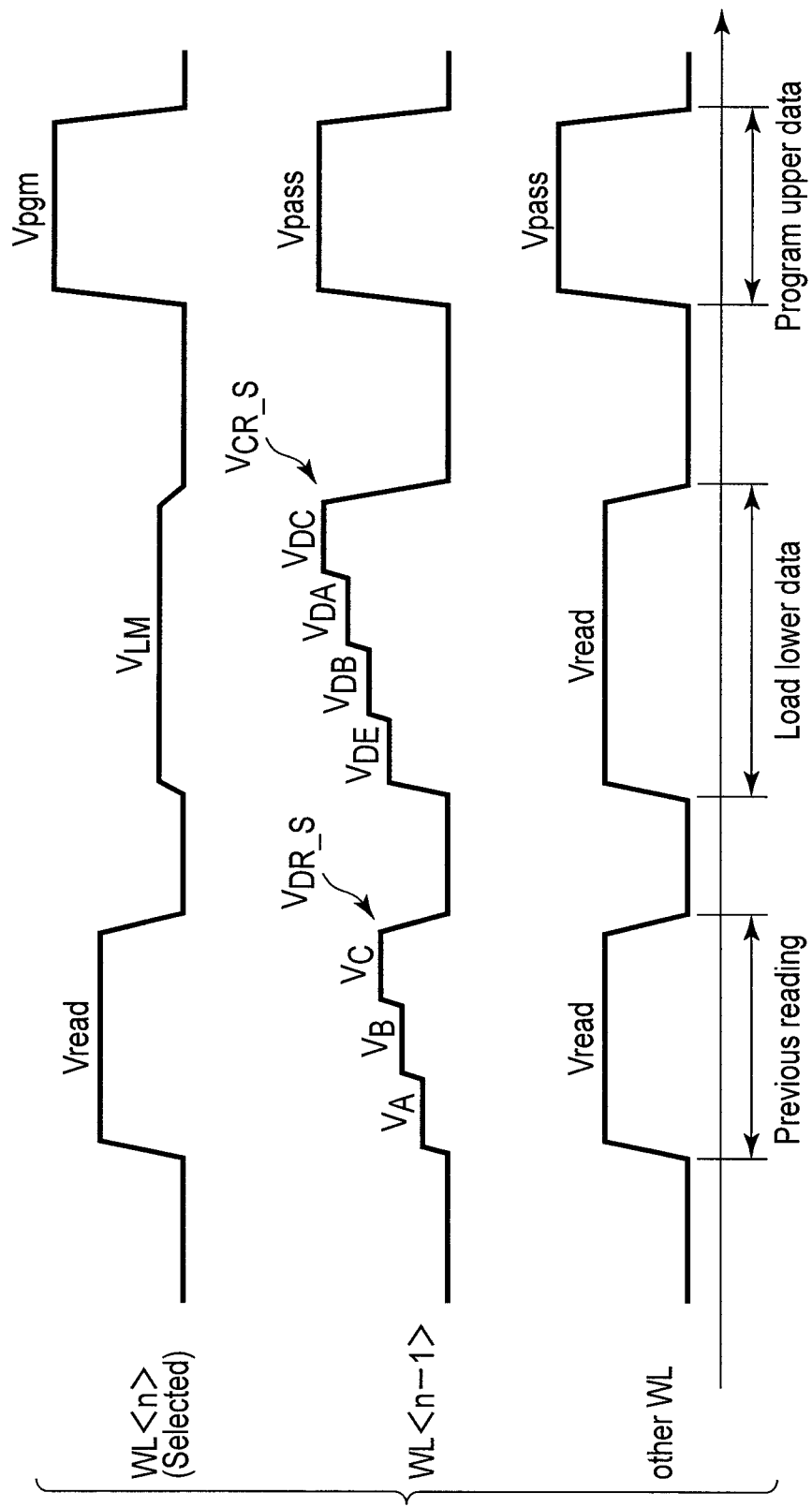

In addition, when upper data is not written to the memory cell MC of source line side adjacent word line WL(n−1), as shown in FIG. 7B, the correction read pass voltage $V_{CR\_S}$ including a correction value for the memory cell MC at the E-state and a correction value for the memory cell MC at the LM-state may be used during the LM-reading in the selected cell MC.

The magnitude relationship between the voltage values $V_{DE}$, $V_{DA}$, $V_{DB}$, and $V_{DC}$ of the correction read pass voltage $V_{CR\_S}$ and the read pass voltage Vread is not limited to the relationship shown here by way of example. However, the magnitude relationship of the voltage values $V_{DE}$, $V_{DA}$, $V_{DB}$, and $V_{DC}$ is $V_{DE} < V_{DA} < V_{DB} < V_{DC}$. Otherwise, as the correction read pass voltage $V_{CR\_S}$ shown in FIG. 7C, the magnitude relationship of the voltage value $V_{DA}$ and the voltage value $V_{DB}$ is changed, and the magnitude relationship of the voltage values may be $V_{DE} < V_{DB} < V_{DA} < V_{DC}$. This is because the amount of movement of the threshold distribution from the E-state to the A-state and the amount of movement of the threshold distribution from the LM state to the C-state may be greater than the amount of movement of the threshold distribution from the LM state to the B-state. The amount of movement of the threshold distribution from an E("1")-state to the an E("11")-state is smallest.

When the relationship of the voltage values is $V_{DE} < V_{DB} < V_{DA} < V_{DC}$, the reading order (order of voltage value changes) can be modified from the example in FIG. 7A. For example, as the correction read pass voltage $V_{CR\_S}$ shown in FIG. 7D, the voltage value $V_{DE}$, the voltage value $V_{DB}$, the voltage value $V_{DA}$, and the voltage value $V_{DC}$ can be set in this order.

Figure 7E:
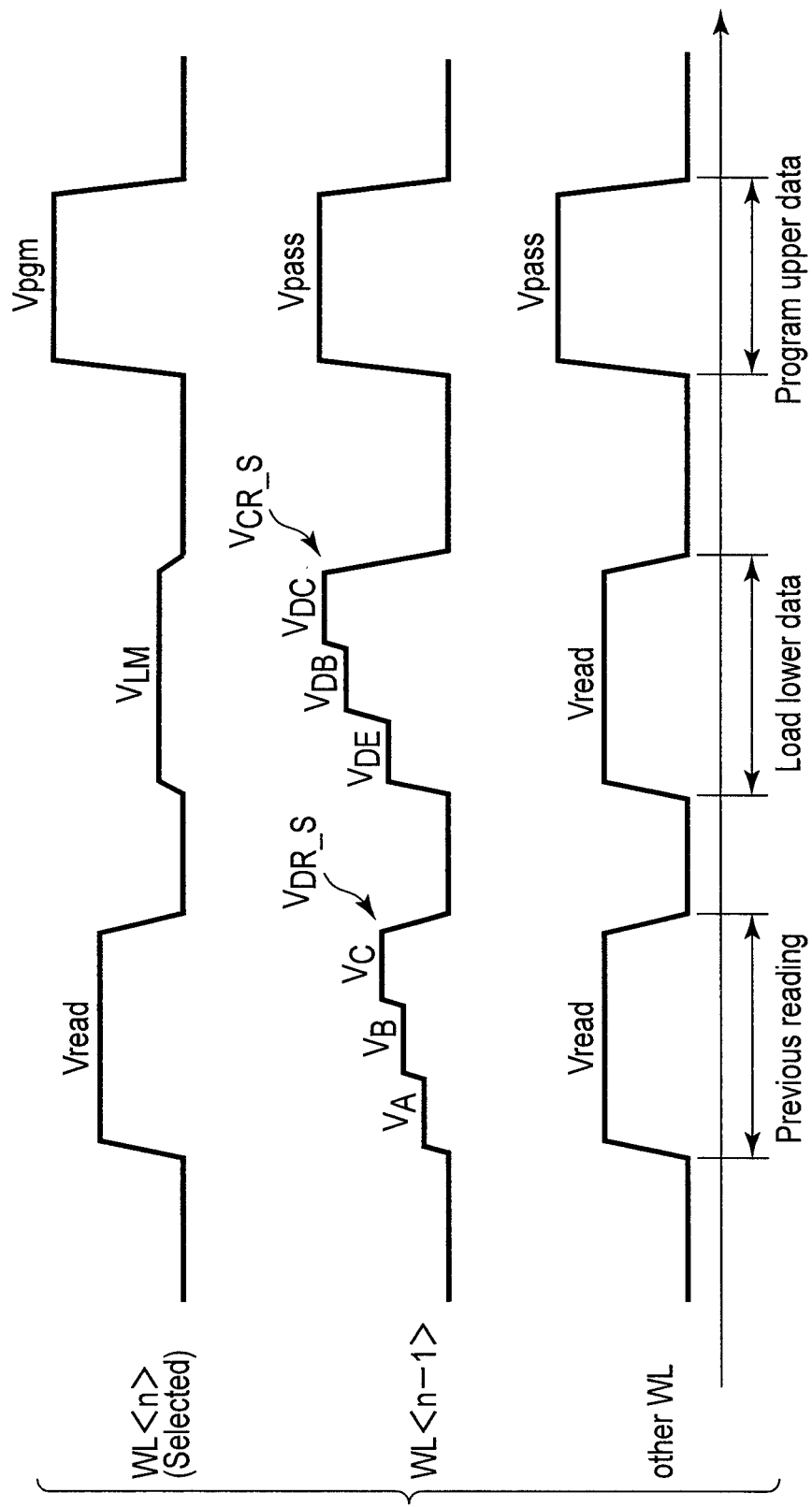

The memory cell MC connected to source line side adjacent word line WL(n−1) may not include one or two of the four threshold state depending on the lower/upper data to be stored. In this case, a voltage pulse including three or two voltage values may be used as the source line side read pass voltage $V_{CR\_S}$. For example, when the memory cell MC connected to the source line side adjacent word line WL(n−1) may not include the memory cell MC at the A-state, as shown in FIG. 7E, the correction read pass voltage $V_{CR\_S}$ without the correction voltage values $V_{DA}$ is applied to the source line side adjacent word line WL(n−1) during the LM-reading. When the threshold voltages of all the memory cells MC connected to source line side adjacent word line WL(n−1) are at one state, the source line side read pass voltage $V_{CR\_S}$ may be a voltage pulse having a constant voltage value. Thereby, the period of the LM-reading that reflects the result of the previous reading in the adjacent cell MC can be reduced.

For example, when it is determined as a result of the previous reading that the memory cells MC connected to source line side adjacent word line WL(n−1) do not include the memory cells MC of the E-state and the B-state, the correction read pass voltage may be a voltage pulse which changes at two stages: the voltage value $V_{DA}$ and the voltage value $V_{DC}$.

In the LM mode of the flash memory, the reading of lower data from the memory cell of the selected word line before the writing of upper data may be affected by the threshold state (data holding state) of the memory cell of the source line side adjacent word line.

For example, in a plurality of adjacent memory cells, if the threshold voltage of a certain memory cell rises as a result of data writing, the threshold voltage of the adjacent memory cell may be detected to be higher or lower than the original intensity because of the adjacent interference effect.

When lower data in word line WLn is loaded (LM-read) during the application of the uncorrected read voltage Vread having a constant voltage value to the adjacent word line, the data "1" may be erroneously determined (erroneously read) to be the data "0" under the influence of the threshold voltage of the memory cell of the adjacent word line. When upper data is written in the memory cell in accordance with the erroneously determined lower data, for example, the data to be written as "01" may be written to the memory cell as "00", or the data to be written as "11" may be written as "10".

Failure bits in the memory cell array 1 may increase because of erroneous determination of the lower data in the memory cell affected by the adjacent cells.

The influence of the adjacent interference effect tends to increase with the miniaturization of memory cells. As a result of the miniaturization of the memory cells, erroneous determination of data associated with the adjacent interference effect may increase, and failure bits in the memory cell array may significantly increase.

In the sequence of writing upper data to word line WLn, under the control of the internal control circuit 8, the flash memory 100 according to the present embodiment reads data in the page allocated to unselected word line WL(n−1) adjacent to selected word line WLn and determines the threshold state of the memory cell (adjacent cell) connected to adjacent word line WL(n−1), before reading (LM-reading) lower data from the memory cell (selected cell) MC connected to selected word line WLn.

The flash memory 100 according to the present embodiment applies, to adjacent word line WL(n−1), the correction read pass voltage $V_{CR\_S}$ based on the result of reading data in the adjacent cell during the reading of lower data from the memory cell MC for writing upper data.

The apparent rise of the threshold voltage of the memory cell MC connected to selected word line WLn is canceled by the application of the correction read pass voltage $V_{CR\_S}$ to adjacent word line WL(n−1). The voltage values $V_{DE}$, $V_{DA}$, $V_{DB}$, and $V_{DC}$ of the correction read pass voltage $V_{CR\_S}$ are adjusted by the correction value to the degree that cancels the apparent threshold rise of the selected cell.

Lower data is thus read from the memory cell MC connected to selected word line WLn while the correction read pass voltage $V_{CR\_S}$ is being applied to adjacent word line WL(n−1), so that the flash memory 100 according to the present embodiment can reduce erroneous determination of the lower data in the memory cell MC to which to write lower data. As erroneous determination of the lower data can be reduced, the flash memory 100 according to the present embodiment can inhibit erroneous writing of lower/upper data.

Consequently, the semiconductor memory according to the first embodiment can improve memory reliability.

(b) Operation

The operation (control method/data writing method) of the flash memory according to the first embodiment is described with reference to FIG. 6 and FIG. 7A. FIG. 1 to FIG. 5 are also used as needed in addition to FIG. 6 and FIG. 7A to describe below the operation of the flash memory according to the present embodiment.

FIG. 6 shows a flowchart of data writing in the flash memory according to the first embodiment. FIG. 7A is a waveform chart showing potentials applied to the word lines in the writing of data in the flash memory according to the first embodiment.

Here, for clearer explanations, the operation of the flash memory according to the present embodiment is described in connection with word line WLn as a selected word line.

For example, in the flash memory 100 in FIG. 1, a control signal (command) from the memory controller 120 or host device 120 is input to the inside of the flash memory 100 via the control signal input/output terminal 10A. An address signal is input to inside of the flash memory 100 from the memory controller 120 or host device 120 via the address signal input/output terminal 100.

When the memory controller 120 or host device 120 instructs the flash memory 100 to write data, the data to be written is input to the inside of the flash memory 100 via the data input/output terminal 10B.

An external address signal is input to the address buffer 9. The internal control circuit 8 in the flash memory 100 may generate an address signal in accordance with the input command.

The address signal is output from the address buffer 9 to the row control circuit 2, the column control circuit 3, and the internal control circuit 8.

In accordance with the command and the address signal, the internal control circuit 8 drives each circuit in the flash memory to perform the requested operation. The row control circuit 2 operates a controlling for the driving of the blocks and pages (word lines) based on the address signal. The potential generation circuit 6 starts the generation of potentials to be applied to the word line WL, the select gate line SGL, the source line SL, and the well region.

During the writing of lower data, data to be written ("1" or "0") is stored in the lower data latch 90 among the data latches shown in FIG. 4. The sense amplifier unit 301 charges or discharges the bit line BL in accordance with the data stored in the lower data latch 90.

As shown in FIG. 6, lower data is written to memory cells connected to word line WLn corresponding to the page indicated by the address signal (step ST0). The lower data ("0" or "1") to be written to the page of word line WLn selected as a target for lower data writing is externally transferred (loaded) to the lower data latch 90 of the latch unit 311 in the data latch circuit 31.

When the data "0" is written to the memory cell MC connected to selected word line WLn, that is, when the threshold voltage of the memory cell is shifted from the erased state to the threshold voltage (LM state) corresponding to the data "0", a write voltage (program voltage) Vpgm of about 20 V is applied to selected word line WLn. Electrons are injected into the charge storage layer of the memory cell MC by a potential difference between the write voltage Vpgm applied to selected word line WLn and a channel region of the memory cell MC. The bit line BL to which the memory cell MC to write the data "0" to is connected is, for example, at a ground voltage (0 V). For example, as shown in FIG. 4, the application of the write voltage that uses a known writing method and verification are repeated until the threshold voltage of the memory cell MC is shifted from the erased state to the range within the threshold distribution corresponding to the data to be written.

When the data "1" is written to the memory cell MC connected to selected word line WLn (when the erased state is maintained), the potential of the channel region of this memory cell MC is boosted up, during the application of the write voltage Vpgm, by the potential (e.g. about 3 to 5 V) transferred from the bit line BL being charged, and a potential difference between selected word line WLn and the channel region is reduced. This prevents the electrons in the memory cell MC connected to selected word line WLn from being injected into the charge storage layer.

An unselect voltage (write pass voltage) Vpass lower than the write voltage is applied to the unselected word lines other than the selected word line. This prevents the writing of data to the memory cells MC connected to the unselected word lines (injection of electrons into the charge storage layers). The write pass voltage Vpass has the degree that prevents the injection of a charge into the charge storage layers of the unselected memory cells MC.

During the writing of data to the selected cell MC, the source line side select transistor STS is turned off, and an on-voltage (voltage equal to or more than the threshold voltage) of the transistor is applied to the gate (select gate line) of the bit line side select transistor STD.

In the writing of data in the LM mode, upper data is written to the memory cell MC of word line WL(n−1) adjacent to the source line side of selected word line WLn after the writing of lower data in the memory cell MC of word line WLn, in the order shown in FIG. 5. After the writing of data to the upper page of word line WL(n−1), lower data is written to the memory cell MC of word line WL(n+1) adjacent to the bit line side of word line WLn.

After the data have been respectively written to source side and bit line side adjacent word lines WL(n−1) and WL(n+1), the page of word line WLn between word lines WL(n−1) and WL(n+1) is selected, and the sequence of writing upper data to the memory cell MC connected to word line WLn is performed.

As shown in FIG. 6, the upper data ("0" or "1") to be written to the page of word line WLn selected as a target for upper data writing is externally transferred (loaded) to the upper data latch 91 of the latch unit 311 in the data latch circuit 31 (step ST1).

In the sequence of writing upper data to the memory cell MC connected to word line WLn, upper data corresponding to the page of word line WLn is calculated with lower data loaded from the memory cell MC connected to word line WLn, and the data to be written to the memory cell MC connected to word line WLn (threshold state to be shifted) is decided.

As shown in FIG. 5, data writing progresses from the source line side word line in the block (memory cell array) toward the bit line side word line, so that data is written in the lower/upper page of the source line side word line WL(n−1) before data is written to the upper page of word line WLn.

In writing in the upper page of word line WLn, the memory cell MC connected to word line WLn is affected by the threshold voltage of the memory cell MC connected to source line side adjacent word line WL(n−1). Therefore, the lower data may be erroneously determined during the loading of the lower data from the memory cell MC connected to word line WLn.

As shown in FIG. 6 and FIG. 7A, in the present embodiment, data is internally read (previous reading/LM DLA) from the memory cell MC connected to source line side adjacent word line WL(n−1) under the control of the internal control circuit 8 before the internal reading of lower data from the page of selected word line WLn (step ST2).

The previous read voltage $V_{DR}$ s including the voltage values $V_A$, $V_B$, and $V_C$ corresponding to the determination voltage for the upper data is used to determine which data is stored (which threshold state is taken) in the memory cells MC connected to source line side adjacent word line WL(n−1).

As the previous read voltage $V_{DR\_s}$ for source line side adjacent word line WL(n−1) is applied to source line side adjacent word line WL(n−1), it is determined regarding the memory cells MC connected to source line side adjacent word line WL(n−1) which of the threshold distributions at the states E-, A-, B- and C- as the threshold voltage of the memory cell MC storing upper data is present in.

As shown in FIG. 7A, in the previous reading in the unselected memory cell MC connected to adjacent word line WL(n−1), the uncorrected read unselect voltage (read pass voltage) Vread having a constant voltage value is applied to the word line WLn and the unselected word lines otherWL other than adjacent word line WL(n−1).

The result (data stored in the memory cell MC) of the previous reading in the memory cell MC connected to source line side adjacent word line WL(n−1) is stored, for example, in the latch of the latch unit 311.

In accordance with the result of the previous reading in source line side adjacent word line WL(n−1), the internal control circuit 8 decides a correction value to be set for the correction read pass voltage $V_{CR\_S}$ of source line side adjacent word line WL(n−1).

Data in the lower page of selected word line WLn is read (LM-read) under the control of the internal control circuit 8 (step ST3).

During the LM-reading, the LM read voltage $V_{LM}$ is applied to selected word line WLn. Depending on whether the selected cell MC storing the lower data is turned on by the application of the LM read voltage $V_{LM}$, the charged state (high level) of the precharged bit line BL is maintained or changed to a discharged state (low level). In accordance with the change of the potential of the bit line BL, the lower data (the state of the threshold voltage) stored in the selected cell MC is stored in the latch unit 311 in the data latch circuit 31.

During the LM-reading, the upper data to be stored in the memory cell MC of word line WLn, and the lower data read from the memory cell MC of selected word line WLn are stored in the latch unit 311. For example, the lower/upper data for the selected cell of the selected word line are stored in the lower/upper data latches 90 and 91 in the latch unit 311. The lower data read from the selected cell MC by the LM-reading may be stored in a latch provided for the LM-reading.

During the LM-reading, the lower/upper data previously read from the adjacent cell MC of adjacent word line WL(n−1) may be stored in the latch unit 311. For example, the lower/upper data previously read from the adjacent cell MC are stored in the latches 92 and 93 for holding flag/verify results or for previous reading.

In the present embodiment, during a period in which the LM read voltage $V_{LM}$ is applied to selected word line WLn in the LM-reading, the correction read pass voltage $V_{CR\_S}$ based on the result of the previous reading is applied to source line side adjacent word line WL(n−1) in parallel with the application of the LM read voltage $V_{LM}$.

That is, while the correction read pass voltage $V_{CR\_S}$ is being applied to source line side adjacent word line WL(n−1), the LM-reading in the selected cell MC is performed, and the threshold state (the erased state or the LM state) of the memory cell MC of selected word line WLn is determined.

The read pass voltage Vread is applied to the unselected word lines otherWL other than source line side adjacent word line WL(n−1). During the LM-reading, the read pass voltage Vread applied to the unselected word lines otherWL other than the adjacent word line WL(n−1) does not include a correction value that takes into consideration the state of the threshold voltage of the memory cells (unselected cells) connected to the unselected word lines otherWL.

In the application periods of the voltage values $V_{DE}$, $V_{DA}$, $V_{DB}$, and $V_{DC}$ of the correction read pass voltage $V_{CR\_S}$, the threshold voltage of the selected cell MC connected to selected word line WLn is determined. In accordance with the result of the previous reading stored in the latch unit 311, the control circuit 8 applies the voltage values $V_{DE}$, $V_{DA}$, $V_{DB}$, and $V_{DC}$ as the correction read pass voltage $V_{CR\_S}$ to source line side adjacent word line WL(n−1).

In the LM-reading using the correction read pass voltage $V_{CR\_S}$ to source line side adjacent word line WL(n−1), for example, after all bit lines BL in the block are charged, a determination of the threshold voltage of the memory cell of the selected word line WLn is operated by a detection of a charge state or a discharge state in the bit line BL in the period of the voltage value $V_{DE}$ of the correction read pass voltage $V_{CR\_S}$. The result of the detection of the charge/discharge state in each of the bit lines BL as the data read from the memory cell is stored in the data latch circuit 31, respectively. And then, bit lines BL is charged again, a determination of the threshold voltage of the memory cell is operated by a detection of a charge/discharge state in the bit line BL in the period of the voltage value $V_{DA}$ of the correction read pass voltage $V_{CR\_S}$. Similarly, in the periods of the voltage value $V_{DB}$ and voltage value $V_{DC}$ of the correction read pass voltage $V_{CR\_S}$, determinations of the threshold voltage of the memory cell MC is operated.

Accordance with the data of the memory cell of source line side adjacent word line WL(n−1) by the previous reading, one determination is selected among the determinations of the threshold voltage of the memory cell in each of the voltage values $V_{DE}$, $V_{DA}$, $V_{DB}$ and $V_{DC}$ of the correction read pass voltage $V_{CR\_S}$. Thereby, data read from the memory cell connected to the selected word line WLn by the LM-reading is decided.

However, the LM-reading in each of the selected cells MC may be selectively performed depending on the threshold state of the memory cell MC of source line side adjacent word line WL(n−1).

For example, in the period of the voltage value $V_{DE}$ of the correction read pass voltage $V_{CR\_S}$, the lower data in the selected cell MC adjacent to the memory cell MC at the E-state is read, and the reading of the lower data in the memory cells MC other than the selected cell MC adjacent to the memory cell MC at the E-state is stopped. In the application period of the voltage value $V_{DA}$ of the correction read pass voltage $V_{CR\_S}$, the lower data in the selected cell MC adjacent to the memory cell MC at the A-state is read, and the reading of the lower data in the memory cells MC other than the selected cell MC adjacent to the memory cell MC at the A-state is stopped.

Similarly, in the application periods of the voltage values $V_{DB}$ and $V_{DC}$ of the correction read pass voltage $V_{CR\_S}$, the lower data in the selected cell MC adjacent to the memory cell MC at the B- or C-state is read, and the reading of the lower data in the memory cells MC other than the selected cell MC adjacent to the memory cell MC at the B- or C-state is stopped.

The correction read pass voltage $V_{CR\_S}$ including the voltage values $V_{DE}$, $V_{DA}$, $V_{DB}$, and $V_{DC}$ that takes into consideration the rise (or fall) of the threshold voltage is applied to source line side adjacent word line WL(n−1) in accordance with the result of the previous reading, so that the adjacent interference effect between the selected cell MC and the source line side adjacent cell MC is nearly canceled. As a result, the accuracy of the reading of lower data in the memory cell MC can be improved in the memory cell MC of selected word line WLn to which the page targeted for upper data writing is allocated.

Even when the writing of data does not follow the writing order in FIG. 5, the adjacent interference effect resulting from the adjacent cell in the LM state or the erased state in source line side adjacent word line WL(n−1) can be lessened by the previous reading and by the correction reading that reflects the result of the previous reading.

After the lower data in the selected cell MC is read in the latch unit 311 by the LM-reading, the upper data to be written to the selected cell MC and lower data read from the selected cell MC are calculated, and threshold voltages corresponding to the lower data and the upper data to be stored in the selected cell MC are decided, under the control of the internal control circuit 8. The upper data is written to the selected cell MC connected to selected word line WLn in accordance with the calculation results of the lower data and the upper data (step ST4).

In order to shift the threshold voltage of the selected cell MC to the decided threshold state (within the threshold distribution), the write voltage Vpgm is applied to selected word line WLn, and data is written to the selected cell MC. The write pass voltage (write unselect voltage) Vpass is applied to source line side adjacent word line WL(n−1) and the other unselected word lines otherWL.

During the application of the write voltage Vpgm to selected word line WLn, the potential of each bit line BL is controlled so that, for example, the threshold voltage of each of the selected cells MC connected to selected word line WLn will fall within a predetermined range (threshold distribution) corresponding to the data to be written.

For example, in data writing, write verify and the application of the write voltage are repeated by a known write method until the threshold voltage of the selected cell MC reaches a predetermined threshold state. In FIG. 7A, a rectangular voltage pulse is shown as the write voltage Vpgm for simplicity. The intensity and pulse width of the write voltage Vpgm may be adjusted during the application of the write voltage Vpgm to selected word line WLn so that the threshold voltage of each of the selected cells MC will fall within the predetermined threshold distribution corresponding to the data to be written.

As a result, the threshold voltage of the selected cell MC connected to word line WLn is brought to the threshold state corresponding to the data to be stored, in accordance with the calculation results of the upper and lower data (results of logic synthesis).

Data is written to the memory cells MC of selected word line WLn by the operation described above.

Subsequently, the writing of the lower data and the writing of the upper data shown in FIG. 6 and FIG. 7A are sequentially performed in the order shown in FIG. 5 in accordance with the external address.

In the writing of data in the flash memory 100 according to the present embodiment, data is internally read previously from the memory cell MC connected to unselected word line WL(n−1) adjacent to selected word line WLn on the source line side before the internal reading (LM-reading) of lower data from the selected cell MC, in the sequence of writing upper data to the memory cell MC connected to word line WLn.

As a result, the threshold state of each of the memory cells MC connected to adjacent word line WL(n−1) is determined before the reading of the lower data from the memory cell MC of selected word line WLn.

In the sequence of writing upper data to the selected cell MC, lower data is read from the selected cell MC of selected word line WLn while the correction read pass voltage $V_{CR\_S}$ that reflects the result of the previous reading is being applied to source line side adjacent word line WL(n−1).

In the reading of the lower data from the selected cell MC, the adjacent interference effect generated between the selected cell MC and the source line side adjacent cell MC is nearly canceled by the application of the correction read pass voltage $V_{CR\_S}$ to adjacent word line WL(n−1).

Therefore, according to the flash memory and its data writing method in the present embodiment, in the sequence of writing upper data to the selected cell MC, the lower data in the selected cell MC can be more accurately read than when the lower data is read from the selected cell while the read pass voltage Vread that does not take into consideration the influence of the threshold voltage of the adjacent cell is being applied to the adjacent word line.

Consequently, according to the flash memory and its data writing method in the present embodiment, erroneous determination of the lower data stored in the selected cell MC in the write sequence of upper data can be reduced, and erroneous writing of lower/upper data to the selected cell MC can be inhibited.

In addition, depending on the threshold voltage of the memory cell connected to source line side adjacent word line WL(n−1) and the result of the previous reading in the memory cell connected to source line side adjacent word line WL(n−1), the correction read pass voltage $V_{CR\_S}$ having the pulse shape as shown in the FIGS. 7B to 7E may be applied to source line side adjacent word line WL(n−1) during the LM-reading in the selected cell MC connected to the selected word line WLn.

As described above, the reliability of the memory can be improved according to the flash memory and its operation in the first embodiment.

(2) Second Embodiment

A semiconductor memory (e.g. flash memory) and its operation (control method/data writing method) according to the second embodiment are described with reference to FIG. 8. The configuration, function, and operation in the second embodiment similar to those in the first embodiment are described when necessary.

Figure 8:
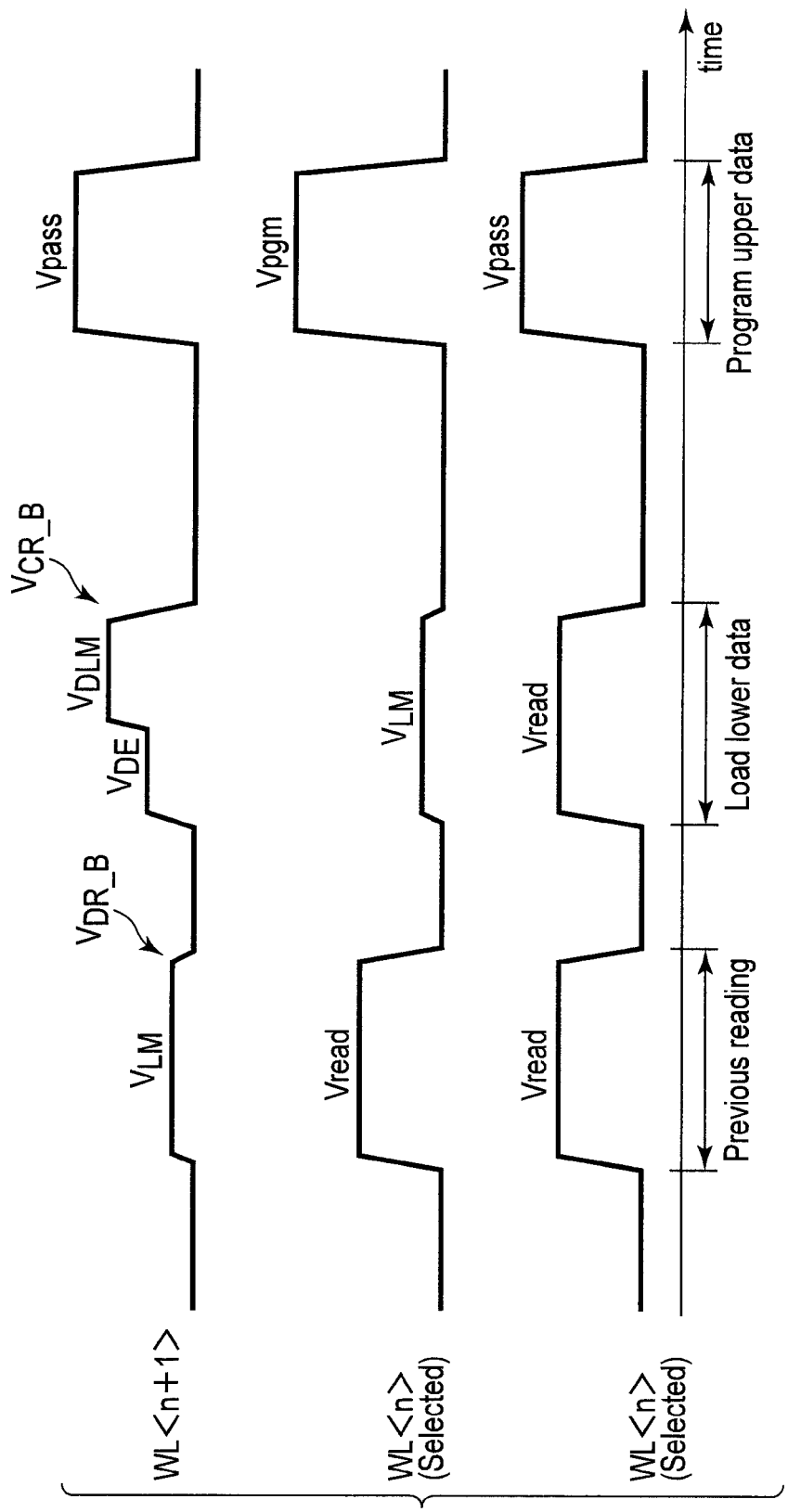
FIG. 8 is a waveform chart illustrating an operational example of a semiconductor memory according to a second embodiment.

FIG. 8 is a waveform chart showing potentials applied to word lines in the writing of data in the semiconductor memory according to the second embodiment.

In addition to interference between the selected cell MC of selected word line WLn and the memory cell MC of source line side adjacent word line WL(n−1), interference may be generated between the selected cell MC of selected word line WLn and the memory cell MC of unselected word line WL(n+1) on the bit line side of selected word line WLn.

When data is written in the order shown in FIG. 5, the threshold state of the memory cell (adjacent cell) MC of bit line side adjacent word line WL(n+1) is the erased state (E-state) or the LM state during the sequence of writing upper data to the selected cell MC connected to word line WLn.

That is, the selected cell MC connected to word line WLn is not only affected by the adjacent interference effect resulting from the writing of upper data in source line side adjacent word line WL(n−1) but also affected by the adjacent interference effect resulting from the writing of lower data in bit line side adjacent word line WL(n+1). For example, when the memory cell MC of bit line side adjacent word line WL(n+1) is at the E-state, the threshold voltage of the memory cell (selected cell) MC in selected word line WLn may be determined to be lower than the original threshold voltage.

Therefore, it is preferable to take into consideration the adjacent interference effect resulting from the memory cells MC of bit line side adjacent word line WL(n+1) as well as source line side adjacent word line WL(n−1).

As shown in FIG. 8, in the flash memory and its data writing method according to the second embodiment, during the sequence of writing upper data to the memory cell MC connected to word line WLn, data is internally read (previous reading/LM DLA) from the memory cell (unselected cell/adjacent cell) MC connected to bit line side adjacent word line WL(n+1) before the internal reading (LM-reading) of lower data from the selected cell MC (step ST2 in FIG. 6).

In accordance with the result of the reading of data from the unselected cell MC connected to bit line side adjacent word line WL(n+1), the internal control circuit 8 decides a correction value for the correction read pass voltage $V_{CR\_B}$ for bit line side adjacent word line WL(n+1).

In the LM-reading in the selected cell MC (step ST3 in FIG. 6), lower data in the selected cell MC of selected word line WLn is read while the bit line side correction read pass voltage $V_{CR\_S}$ is being applied to bit line side adjacent word line WL(n+1).

As shown in FIG. 5, upper data is written to the memory cell MC of bit line side adjacent word line WL(n+1) after the writing of upper data to the selected cell MC of selected word line WLn.

Therefore, the memory cell MC of bit line side adjacent word line WL(n+1) is in the erased state (storing the data "1") or the LM state (storing the data "0").

Thus, as shown in FIG. 8, the LM read voltage $V_{LM}$ is used as the read voltage $V_{DR}$ s for the previous reading in the memory cell MC of the bit line side adjacent word line WL(n+1). The LM read voltage $V_{LM}$ is applied to bit line side adjacent word line WL(n+1) during the previous reading in the memory cell MC of bit line side adjacent word line WL(n+1).

In the previous reading in the memory cell MC of bit line side adjacent word line WL(n+1), the read pass voltage Vread is applied to the selected word line WLn and the unselected word lines otherWL other than bit line side adjacent word line WL(n+1).

A bit line side correction read pass voltage $V_{CR\_B}$ in accordance with the result of the previous reading includes, for example, two voltage values. In the bit line side correction read pass voltage $V_{CR\_B}$, one voltage value $V_{DE}$ includes a correction value corresponding to the erased state (data "1" holding state) of the memory cell MC, and the other voltage value $V_{DLM}$ includes a correction value corresponding to the LM state (data "0" holding state) of the memory cell MC.

For example, the voltage value $V_{DLM}$ of the correction read pass voltage $V_{CR\_B}$ includes a correction value for the memory cell MC in the "LM" state, and is, for example, higher than the voltage value of the read pass voltage Vread.

When all the memory cells MC connected to bit line side adjacent word line WL(n+1) are in the erased state in the result of the previous reading (LM DLA) in the memory cell MC of bit line side adjacent word line WL(n+1), the bit line side correction read pass voltage $V_{CR\_B}$ may be a voltage pulse which is constant in the voltage value $V_{DE}$. When all the memory cells MC connected to bit line side adjacent word line WL(n+1) are in the LM state in the result of the previous reading, the bit line side correction read pass voltage $V_{CR\_B}$ may be a voltage pulse which is constant in the voltage value $V_{DLM}$.

In the LM-reading in the memory cell MC of selected word line WLn, the read select voltage (LM read voltage) $V_{LM}$ is applied to selected word line WLn, and the bit line side correction read pass voltage $V_{CR\_B}$ which changes at two stages is applied to bit line side adjacent word line WL(n+1).

For example, in the application periods of the voltage values $V_{DE}$ and $V_{DLM}$ of the correction read pass voltage $V_{CR\_B}$, the threshold voltages of all the memory cells MC connected to selected word line WLn are determined.

Reading of lower data may be only performed in the memory cell MC adjacent to the memory cell MC at the E-state in the period of the voltage value $V_{DE}$ of the correction read pass voltage $V_{CR\_B}$, and reading of lower data may be only performed in the selected cell MC adjacent to the memory cell MC at the "LM"-state in the period of the voltage value $V_{DLM}$ of the correction read pass voltage $V_{CR\_B}$.

In the LM-reading, the read pass voltage Vread is applied to the unselected word lines otherWL other than bit line side adjacent word line WL(n+1).

In accordance with the result of the LM-reading, upper data is written to the selected cell MC of selected word line WLn.

In the present embodiment, the lower data stored in the selected cell of selected word line WLn is internally read while the bit line side correction read pass voltage $V_{CR\_B}$ that takes into consideration the threshold state of the adjacent cell on the bit line side is being applied to bit line side adjacent word line WL(n+1).

As a result, in the flash memory 100 according to the present embodiment, interference between the selected cell MC and the memory cell MC of bit line side adjacent word line WL(n+1) is lessened, and erroneous determination of the lower data stored in the selected cell MC is reduced, in the sequence of writing upper data to the selected cell MC of selected word line WLn.

Therefore, erroneous writing of lower/upper data to the memory cell MC connected to selected word line WLn can be reduced.

Thus, according to the flash memory and its operation in the second embodiment, the reliability of the memory can be improved as in the first embodiment.

(3) Third Embodiment

A semiconductor memory (e.g. flash memory) and its operation (control method/data writing method) according to the third embodiment are described with reference to FIG. 9. The configuration, function, and operation in the third embodiment similar to those in the semiconductor memory and its operation according to the first and second embodiments are described when necessary.

Figure 9A:
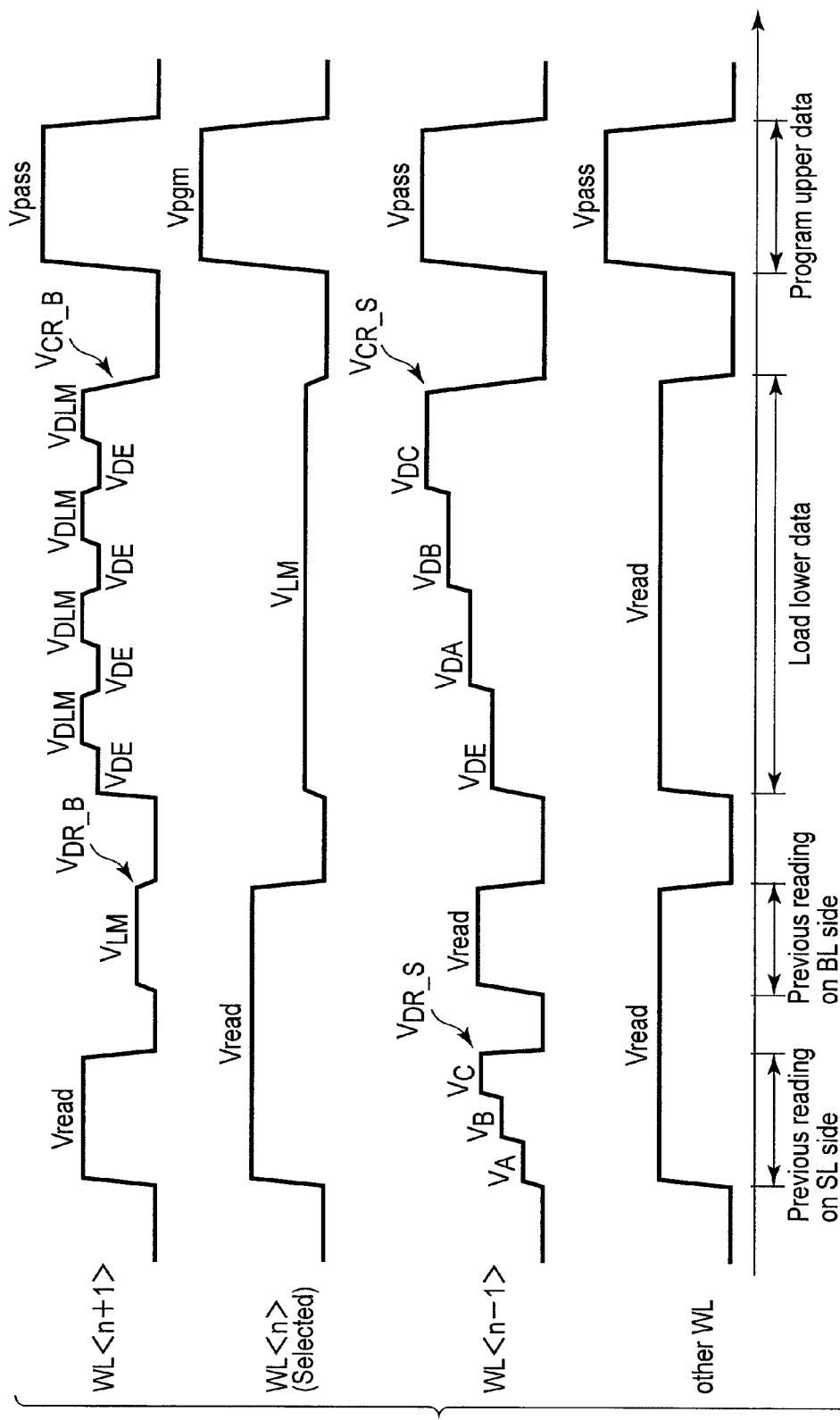
FIGS. 9A and 9B are waveform charts illustrating an operational example of a semiconductor memory according to a third embodiment.
Figure 9B:
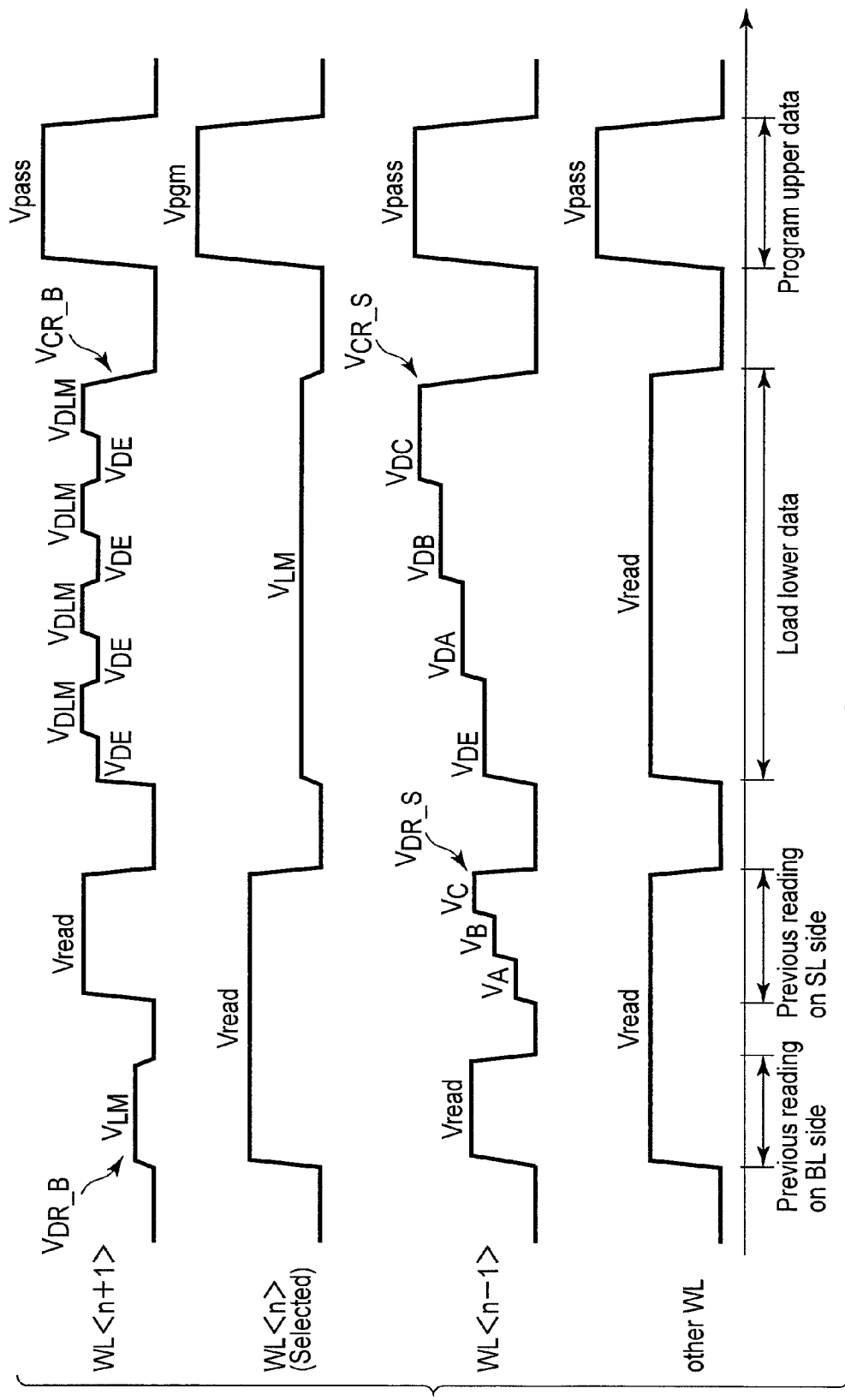

FIGS. 9A and 9B are waveform charts showing potentials applied to word lines in the writing of data in the semiconductor memory according to the third embodiment.

In the examples of the flash memory shown in the first and second embodiments, during the sequence of writing upper data to the memory cell MC of selected word line WLn, previous reading is performed in the memory cells MC connected to word lines WL(n−1) and WL(n+1) regarding one of word lines WL(n−1) and WL(n+1) adjacent to selected word line WLn on the source line side and the bit line side. Then lower data is internally read from the memory cell MC of selected word line WLn while the correction read pass voltage (correction unselect voltage) generated in accordance with the result of the previous reading is being applied to one of adjacent word lines WL(n−1) and WL(n+1) on the source line side and the bit line side.

However, during the operation of the flash memory, the selected cell MC connected to selected word line WLn is affected by both the threshold states of the memory cells MC connected to adjacent word lines WL(n−1) and WL(n+1) on the source line side and the bit line side.

As shown in FIG. 9A, during the sequence of writing upper data to the memory cell MC of selected word line WLn, the flash memory according to the third embodiment performs previous reading in the both memory cells MC of word lines WL(n−1) and WL(n+1) adjacent to selected word line WLn on the source line side and the bit line side before the LM-reading in the memory cell MC of selected word line WLn, under the control of the internal control circuit 8.

As shown in FIG. 9A, previous reading is performed in each of the memory cells MC connected to bit line side adjacent word line WL(n+1) after the previous reading in the memory cell MC connected to source line side adjacent word line WL(n−1).

However, as shown FIG. 9B, previous reading may be performed in the memory cell MC of source line side adjacent word line WL(n−1) after the previous reading in the memory cell MC of bit line side adjacent word line WL(n+1).

The flash memory 100 according to the present embodiment performs LM-reading of lower data from the memory cell MC of selected word line WLn while the correction read pass voltages $V_{CR\_S}$ and $V_{CR\_B}$ are being applied to both adjacent word lines WL(n−1) and WL(n+1) on the source line side and the bit line side.

For example, as shown in FIGS. 9A and 9B, the number of levels of voltage value included in the bit line side correction read pass voltage $V_{CR\_B}$ is smaller than the number of levels of the voltage value included in the source line side correction read pass voltage $V_{CR\_S}$.

In a period in which the LM-reading is performed, the bit line side correction read pass voltage $V_{CR\_B}$ is applied to bit line side adjacent word line WL(n+1) simultaneously with the application of the source line side correction read pass voltage $V_{CR\_S}$ to source line side adjacent word line WL(n−1).

For example, in a period in which the source line side correction read pass voltage $V_{CR\_S}$ has the voltage value $V_{DE}$, the bit line side correction read pass voltage $V_{CR\_B}$ has the voltage value $V_{DE}$ and the voltage value $V_{LM}$. Similarly, in periods in which the source line side correction read pass voltage $V_{CR\_S}$ has the voltage value $V_{D4}$, the voltage value $V_{DE}$, and the voltage value $V_{DC}$, the bit line side correction read pass voltage $V_{CR\_B}$ has the voltage value $V_{DE}$ and the voltage value $V_{LM}$. In this case, in the period of the LM-reading in selected word line WLn, the bit line side correction read pass voltage $V_{CR\_B}$ has a pulse shape that alternates between the voltage value $V_{DE}$ and the voltage value $V_{LM}$.

For example, the number of latches in the latch unit 311 can be increased by one or more to temporarily store the results of the previous readings in both adjacent word lines WL(n−1) and WL(n+1) on the source line side and the bit line side.

As described above, in the present embodiment, previous readings in the adjacent cells are performed for both word lines WL(n−1) and WL(n+1) adjacent to selected word line WLn on the source line side and the bit line side during the sequence of writing upper data to the memory cell MC of selected word line WLn. Then the threshold state of the selected cell MC is determined, and the lower data stored in the selected cell MC is read, while the read pass voltages $V_{CR\_S}$ and $V_{CR\_B}$ corrected in accordance with the result of the previous reading are being applied to both adjacent word lines WL(n−1) and WL(n+1) on the source line side and the bit line side.

Thus, the flash memory and its data writing method according to the present embodiment can further improve the accuracy of the determination of the threshold state of the selected cell MC in the sequence of writing upper data to the memory cell MC of selected word line WLn, and can reduce erroneous determination of the lower data in the selected cell MC in the LM-reading.

Consequently, the flash memory and its data writing method according to the present embodiment can inhibit erroneous writing of lower/upper data to the selected cell MC.

Thus, according to the semiconductor memory and its operation in the third embodiment, the reliability of the memory can be improved as in the first and second embodiments.

(4) Modifications

Modifications of the semiconductor memory (e.g. flash memory) and its operation according to the first to third embodiments are described with reference to FIG. 10 to FIG. 12.

<Modification 1>

Modification 1 of the flash memory and its data writing method according to the embodiments are described with reference to FIG. 10. FIG. 10 is a waveform chart showing potentials applied to the word lines in data writing in the semiconductor memory according to Modification 1.

Figure 10:
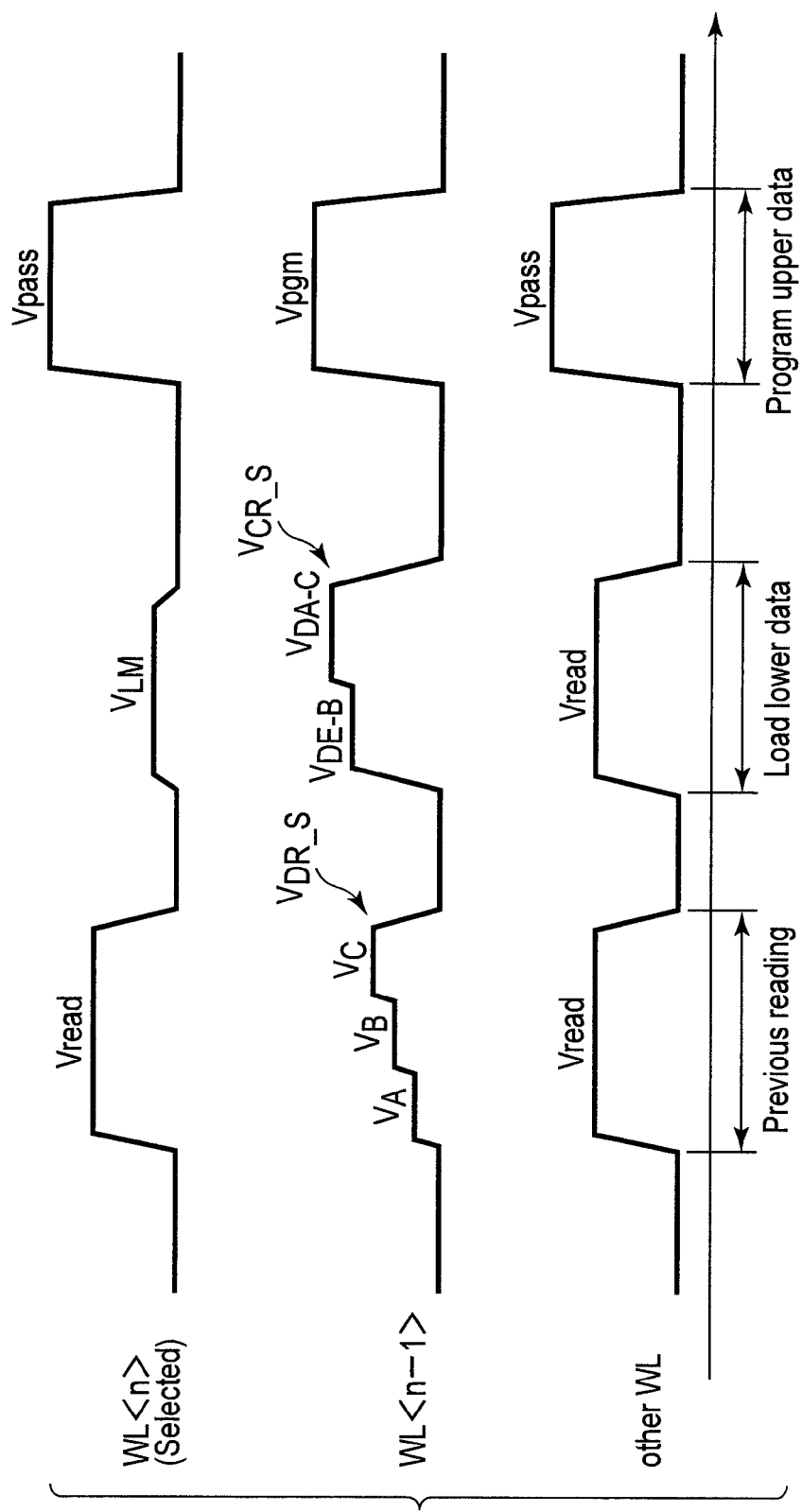

In the example shown in the modification in FIG. 10, the correction values of the correction read pass voltage $V_{CR\_S}$ in FIG. 7A are combined in consideration of the amount of movement of the threshold distribution attributed to the writing of upper data from the writing of lower data. In the case described in the example shown in FIG. 10, the threshold of the memory cell is shifted as shown in FIG. 4. In FIG. 4, a variation of the threshold distribution from the E-state to the A-state and a variation of the threshold distribution from the LM-state to the C-state are great. Moreover, a variation of the threshold distribution from the E("1")-state to the E("11")-state and a variation of the threshold distribution from the LM-state to the B-state are small.

As shown in FIG. 10, the correction amounts of the voltage value $V_{DE}$ and the voltage value $V_{DB}$ in the correction read pass voltage $V_{CR\_S}$ are regarded as substantially equal, and the correction voltage values for the two threshold states are combined into a voltage value $V_{DE-B}$. The correction amounts of the voltage value $V_{DA}$ and the voltage value $V_{DC}$ in the correction read pass voltage $V_{CR\_S}$ are regarded as substantially equal, and the correction voltage values for the two threshold states are combined into a voltage value $V_{DA-C}$.

As a result, the number of steps (the number of changes in voltage value) of the stepped correction read pass voltage $V_{CR\_S}$ is reduced, and the time for loading lower data can be reduced.

<Modification 2>

Figure 11A:
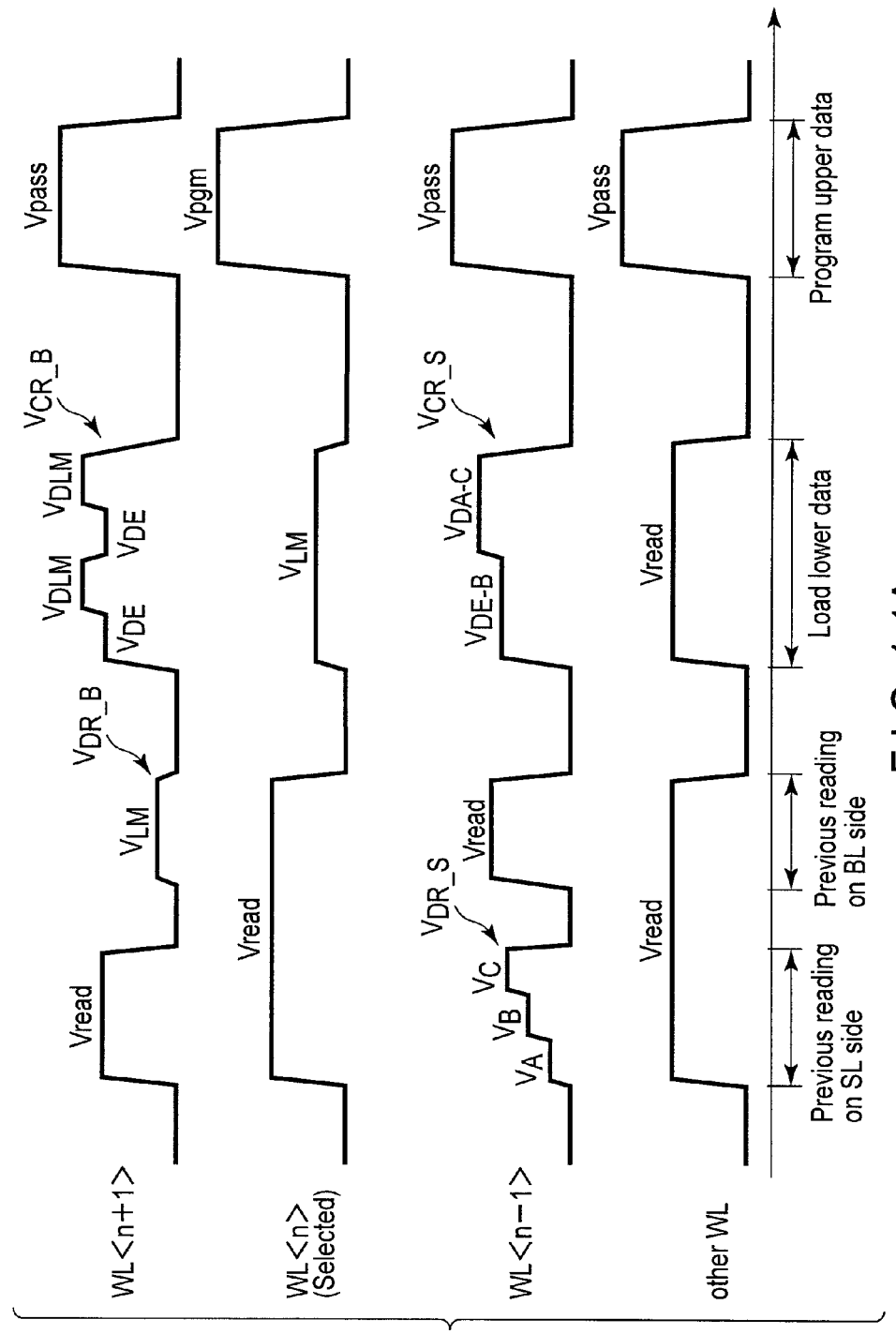
Figure 11B:
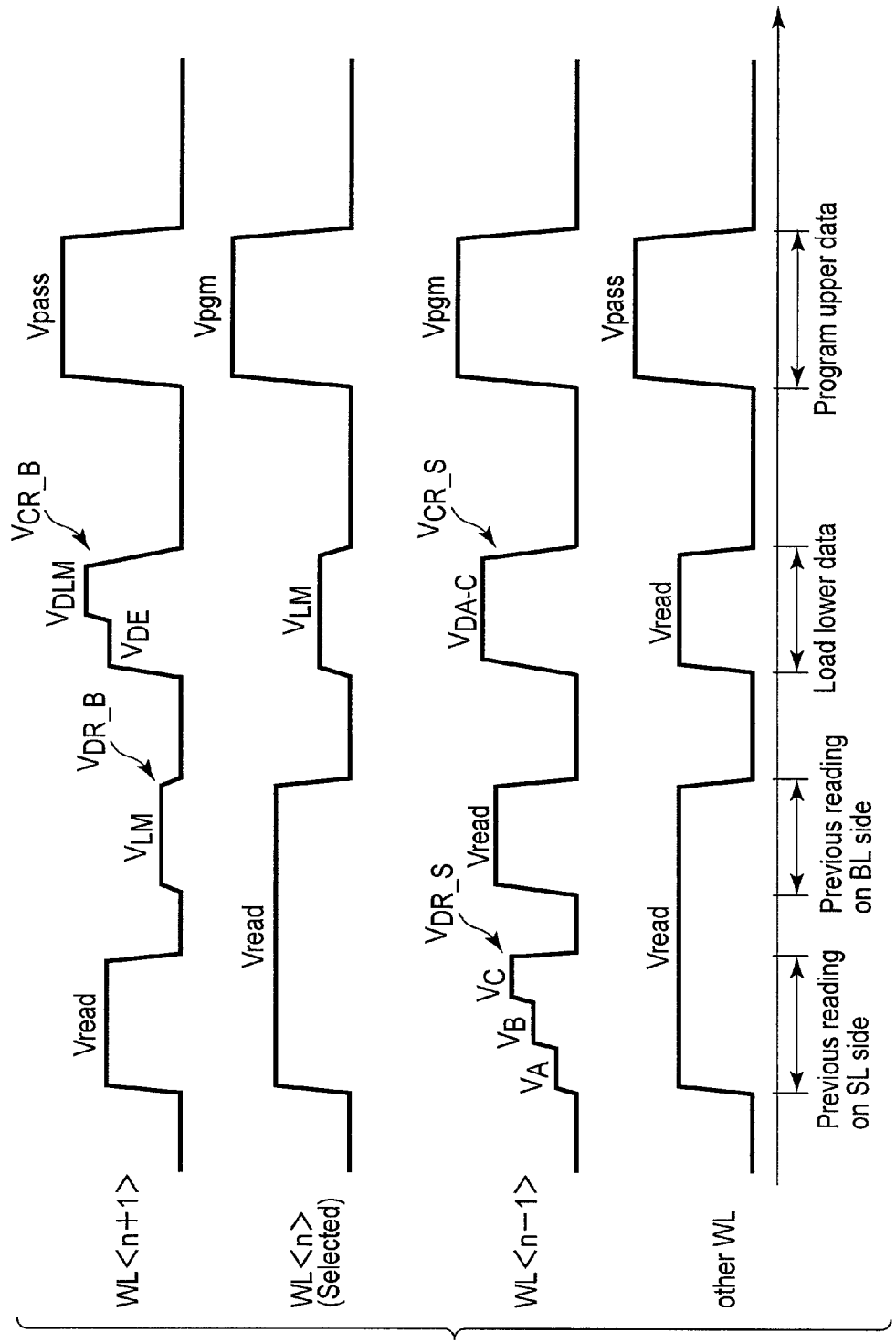

Modification 2 of the flash memory and its data writing method according to the embodiments are described with reference to FIGS. 11A and 11B. FIGS. 11A and 11B are waveform charts showing potentials applied to the word lines in data writing in the semiconductor memory according to Modification 2.

When lower and upper data are written in the order shown in FIG. 5, the lower and upper data have been written in the lower and upper pages allocated to source line side adjacent word line WL(n−1) during the sequence of writing upper data to selected word line WLn. Therefore, the memory cell MC connected to source line side adjacent word line WL(n−1) has one of the threshold states at the E-, A-, B- and C-states. In the embodiments described above, the correction read pass voltage $V_{CR\_S}$ for the memory cell to store 4-state data includes, in its pulse waveform, the four voltage values $V_{DE}$, $V_{DA}$, $V_{DB}$, and $V_{DC}$ corresponding to the respective states.

For example, as shown in FIG. 11A, the correction read pass voltage $V_{CR\_S}$ is separated into the cases of the E-state and B-state and the cases of the A-state and C-state, so that the voltage pulse which changes in voltage value at two stages may be used as the correction read pass voltage $V_{CR\_S}$ for the memory cell MC for storing 4-state data to read lower data in the selected cell MC connected to selected word line WLn.

As shown in FIG. 11A, the correction read pass voltage $V_{CR\_S}$ separated into the cases of the E- and B-states and the cases of the A- and C-states of the threshold voltage of the memory cell (adjacent cell) MC includes a voltage value $V_{DE-B}$ that reflects the correction value for the E- and B-states and a voltage value $V_{DA-C}$ that reflects the correction value for the A- and C-states.

For example, as shown in FIG. 11A, the number of levels of voltage value included in the bit line side correction read pass voltage $V_{CR\_B}$ is equal to the number of levels of the voltage value included in the source line side read pass voltage $V_{CR\_S}$.

Thus, in the LM-reading in the selected cell MC of selected word line WLn, the pulse width of the source line side correction read pass voltage $V_{CR\_S}$ can be reduced by the reduction of the number of steps, and the period of the LM-reading that reflects the result of the previous reading in the adjacent cell MC connected to source line side adjacent word line WL(n−1) can be reduced.

As a result, the period for the write sequence of the flash memory can be reduced.

In the example shown in FIG. 11A, the correction read pass voltage $V_{CR\_S}$ separated into the cases of the E- and B-states and the cases of the A- and C-states is used when the correction read pass voltage is applied to both adjacent word lines WL(n−1) and WL(n+1) on the source line side and the bit line side.

When the adjacent cell MC does not include the E- and B-states, as shown in FIG. 11B, the correction read pass voltage $V_{CR\_S}$ does not need to include the correction value for the E- and B-states. When the adjacent cell MC does not include the A- and C-states, the correction read pass voltage $V_{CR\_S}$ does not need to include the correction value for the A- and C-states.

As described above, in Modification 2 of the semiconductor memory and its operation according to the embodiments shown in FIGS. 11A and 11B, substantially the same advantageous effects as those according to the first to third embodiments are obtained, and the operation of the semiconductor memory can be increased in speed.

<Modification 3>

Modification 3 of the flash memory and its data writing method according to the embodiments are described with reference to FIG. 12. FIG. 12 is a table illustrating a modification of the order of writing lower and upper data to the pages of the flash memory.

In the embodiments described above, a word line to which a page to write data to is allocated is selected in the order (address) shown in FIG. 5, and lower data and upper data are written. However, the order of selecting the word line to which to write the lower data and upper data is not limited to the example shown in FIG. 5.

Figure 12:
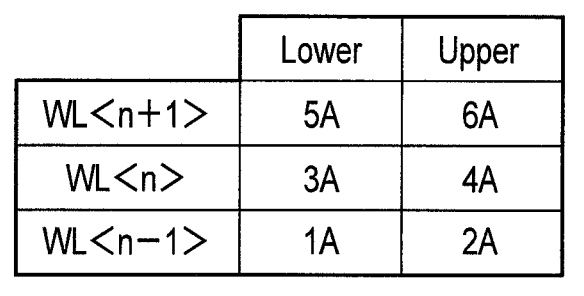

For example, the word lines WL may be sequentially selected in the order shown in FIG. 12, and lower and upper data may be written to the memory cells MC connected to the respective word lines WL.

In the data writing order (address order) shown in FIG. 12, lower data and upper data are sequentially written starting with the source line side word line WL in order.

As shown in FIG. 12, regarding word line WL(n−1) adjacent to a given word line WLn on the source line side, lower data is written to the lower page of word line WL(n−1) (writing order <1A>), and then upper data is written to the upper page of word line WL(n−1) (writing order <2A>).

While the lower/upper data are stored in the memory cells MC connected to word line WL(n−1), lower data is written to the lower page of word line WLn (writing order <3A>), and upper data is then written to the upper page of word line WLn (writing order <4A>).

After the lower/upper data have been written to the memory cells MC connected to word line WLn, data are written to the lower and upper pages of word line WL(n+1) adjacent to word line WLn on the bit line side (writing order <5A> and <6A>).

In the case of FIG. 12, like the above-described embodiments, during the LM reading (lower data reading) in the lower page of selected word line WLn, the memory cell MC connected to the word line WLn may be affected by the threshold voltage of the memory cell MC connected to adjacent word lines. For example, the lower data "1" stored in the memory cell connected to selected word line WLn may be erroneously determined to be the data "0" under the influence of the threshold voltage of the memory cell storing the data in the source line side adjacent word line.

In the example shown in FIG. 12, the threshold state of all the memory cells MC connected to bit line side adjacent word line WL(n+1) is at the E-state in the sequence of writing upper data to the memory cell MC connected to word line WLn.

When data are written in the order shown in FIG. 12, previous reading before the LM-reading (lower data reading) in the memory cells of word line WLn is performed in the pages of word lines WL(n−1) on the source line side, as has been described with reference to FIG. 5 to FIG. 10.

During the LM-reading in word line WLn, the correction read pass voltages $V_{CR\_S}$ that reflect the result of the previous reading are applied to adjacent word lines WL(n−1) on the source line side.

Thus, in the sequence of writing upper data to the selected cell MC of word line WLn, erroneous determination of the lower data in the selected cell MC in the LM-reading can be reduced, and erroneous writing of upper data to the selected cell MC can be inhibited.

In addition, when the method (for example, HBL mode) for controlling the memory cells connected to even and odd bit lines with different timings in each other is used to the operation of the FIG. 12, a correction of unselect voltage applied to adjacent word lines may be operated for the lower data reading in the selected cell connected to the selected word line in accordance with data (threshold voltage) of the unselected cell adjacent to the selected cell in the row direction among the memory cells connected to the selected word line. For example, among the memory cells connected to selected word line WLn, during the LM-reading in memory cells connected to the odd bit lines, corrected unselect voltage is applied to the adjacent word lines and/or even bit lines in accordance with the data (threshold voltage) of the memory cell connected to the adjacent word line on the source line side and the data of memory cell connected to the even bit lines and the selected word line in the previous reading. The correction for the LM-reading (lower data reading) in the HBL mode can also apply to the operation shown in FIG. 5.

Consequently, in Modification 3 of the semiconductor memory and its operation according to the embodiments shown in FIG. 12, substantially the same advantageous effects as those in the semiconductor memory according to the first to third embodiments are obtained.

[Additions]

In the embodiments described above, one memory cell stores 4-value (2-bit) data. However, even when one memory cell stores 8-value (3-bit) or 16-value (4-bit) data, the configuration and operation described in the embodiments can be applied.

When i-value (i is an integer of 2 or more) data can be written to the memory cell, the memory cell includes first, second, . . . , i-th thresholds associated with the i-value.

When j is an integer of 4 or more and of i or less, thresholds that are not adjacent to one another can be indicated as a (j−3)-th threshold (threshold distribution) and a (j−1)-th threshold, and (j−2)-th and j-th thresholds.

When an upper bit (or data) is indicated as k-level (or k-th, k-order) bit (data) in the memory cell for storing i-value data, a bit (data) one bit (level) lower than the k-bit can be indicated as (k−1)-level (or (k−1)-th, (k−1)-order) bit (data). k is an integer of 2 or more.

When the word line located closest to the source line side is selected for the writing of upper data in the previous reading in the adjacent word line according to the embodiments described above, previous reading has only to be performed in the adjacent cell of the bit line side adjacent word line. When the word line located closest to the bit line side is selected for the writing of upper data, previous reading has only to be performed in the adjacent cell of the source line side adjacent word line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a plurality of memory cell units, each of the memory cell units including a plurality of memory cells to which a current path is connected in series and to which i-value (i is an integer of 2 or more) data is writable;
   a plurality of word lines, each of the word lines being connected to gates of the memory cells arranged in a row direction among the memory cells;
   a source line connected to one end of the memory cell units;
   a plurality of bit lines each connected to the other end of the memory cell units; and
   a control circuit which controls an operation of the memory cell units,
   wherein during writing to selected cells connected to a selected word line which is selected as a write target of first k-level data (k is an integer of 2 or more) among the word lines, in a first unselected adjacent word line adjacent to the selected word line on the source line side and a second unselected adjacent word line adjacent to the selected word line on the bit line side, the control circuit applies a first unselect voltage corrected in accordance with a result of reading of data from first unselected cells connected to the first unselected adjacent word line to the first unselected adjacent word line and a second unselect voltage corrected in accordance with a result of reading of data from second unselected cells connected to the second unselected adjacent word line to the second unselected adjacent word line during reading from the selected cells and applies a read voltage to the selected word line to read first (k−1)-level data from the selected cells, and a number of voltage values included in the first unselect voltage is less than a number of voltage values included in the second unselect voltage, and the control circuit writes data to the selected cells in accordance with the read first (k−1)-level data and the first k-level data to be written.

2. The semiconductor memory according to claim 1, wherein first to j-th thresholds associated with the i-value are set for the respective memory cells, and when j is indicated by an integer of 4 or more and of i or less, the first unselect voltage corrected in accordance with the result of the reading of data from the first unselected cells includes a first correction value for (j−3)-th and (j−1)-th thresholds that are not adjacent to each other, and a second correction value for (j−2)-th and j-th thresholds that are not adjacent to each other.

3. The semiconductor memory according to claim 1, wherein the first (k−1)-level data is read from the selected cells before a write voltage to write the first k-level data to the selected cells is applied to the selected word line.

4. The semiconductor memory according to claim 2, wherein the first unselect voltage has a pulse shape in which the first correction value and the second correction value succeed, and the read voltage has a pulse shape constant in voltage value while the first unselect voltage is being applied to the first unselected adjacent word line.

5. The semiconductor memory according to claim 1, wherein during the writing of the first k-level data to the selected cells, the first unselected cells connected to the first unselected adjacent word line store second (k−1)-level data and second k-level data.

6. The semiconductor memory according to claim 5, wherein the second unselected cells connected to the second unselected adjacent word line store third (k−1)-level data.

7. The semiconductor memory according to claim 1, wherein a pulse shape of the second unselect voltage is different from a pulse shape of the first unselect voltage.

8. The semiconductor memory according to claim 1, wherein the control circuit applies a third unselect voltage having a constant voltage value to unselected word lines other than the first and second unselected adjacent word lines while the first and second unselect voltages are being applied to the first and second unselected adjacent word lines.

9. A semiconductor memory control method comprising:
writing first (k−1)-level (k is an integer of 2 or more) data to a first memory cell selected among a plurality of memory cells in at least one memory cell unit, one end of the memory cell unit being connected to a source line, the other end of the memory cell unit being connected to a bit line, the first memory cell having a gate connected to a first word line, and the first word line being adjacent to a second word line on the source line side;

writing second (k−1)-level data to a second memory cell in the at least one memory cell unit, the second memory cell having a gate connected to the second word line;

writing first k-level data to the first memory cell;

writing third (k−1)-level data to a third memory cell in the at least one memory cell unit, the third memory cell having a gate connected to a third word line, and the third word line being adjacent to the second word line on the bit line side;

reading the first (k−1)-level data and the first k-level data in the first memory cell and the third (k−1)-level data in the third memory cell;

applying a first unselect voltage corrected in accordance with a result of the data reading in the first memory cell to the first word line, applying a second unselect voltage corrected in accordance with a result of the data reading in the third memory cell to the third word line, and applying a read voltage to the second word line to read the second (k−1)-level data from the second memory cell, wherein a number of voltage values included in the first unselect voltage is less than a number of voltage values included in the second unselect voltage; and writing data to the second memory cell in accordance with the read second (k−1)-level data and second k-level data to be written.

10. The semiconductor memory control method according to claim 9, wherein:

first to j-th thresholds associated with i-value (i is an integer of 2 or more) data are set for the first and second memory cells, and when j is indicated by an integer of 4 or more and of i or less, the first unselect voltage includes a first correction value for (j−3)-th and (j−1)-th thresholds that are not adjacent to each other and a second correction value for (j−2)-th and j-th thresholds that are not adjacent to each other, in accordance with the result of the data reading in the first memory cell.

11. The semiconductor memory according to claim 1, wherein the reading of data from the first and second unselected cells is sequentially executed.

12. The semiconductor memory according to claim 11, wherein the reading of data from the second unselected cells is executed after the reading of data from the first unselected cells.

13. The semiconductor memory according to claim 1, wherein:

the first unselect voltage includes a first voltage value and the second unselect voltage includes a second voltage value and a third voltage value, and during the reading the first (k−1)-level data from the selected cells, the second and third voltage values are applied to the second unselected adjacent word line while the first voltage value is applied to the first unselected adjacent word line.

14. The semiconductor memory control method according to claim 9, wherein the third (k−1)-level data is read after the first (k−1)-level data and the first k-level data are read.

15. The semiconductor memory control method according to claim 9, wherein:

the first unselect voltage includes a first voltage value and the second unselect voltage includes a second voltage value and a third voltage value, and during the reading of the second (k−1)-level data, the second and third voltage values are applied to the third word line while the first voltage value is applied to the first word line.

16. A semiconductor memory comprising:
a plurality of memory cell units, each of the memory cell units including a plurality of memory cells to which a current path is connected in series and to which i-value (i is an integer of 2 or more) data is writable;
a plurality of word lines, each of the word lines being connected to gates of the memory cells arranged in a row direction among the memory cells;
a source line connected to one end of the memory cell units;
a plurality of bit lines each connected to the other end of the memory cell units; and
a control circuit which controls an operation of the memory cell units,
wherein during writing to selected cells connected to a selected word line which is selected as a write target of first k-level data (k is an integer of 2 or more) among the word lines,
in a first unselected adjacent word line adjacent to the selected word line on the source line side and a second unselected adjacent word line adjacent to the selected word line on the bit line side, the control circuit applies a first unselect voltage corrected in accordance with a result of reading of data from first unselected cells connected to the first unselected adjacent word line to the first unselected adjacent word line and a second unselect voltage corrected in accordance with a result of reading of data from second unselected cells connected to the second unselected adjacent word line to the second unselected adjacent word line during reading from the selected cells and applies a read voltage to the selected word line to read first (k−1)-level data from the selected cells, the first unselect voltage including a first voltage value and a second voltage value and the second unselect voltage including a third voltage value and a fourth voltage value, and during the reading the first (k−1)-level data from the selected cells, the third and fourth voltage values are applied to the second unselected adjacent word line while the first voltage value is applied to the first unselected adjacent word line, and the third and fourth voltage values are applied to the second unselected adjacent word line while the second voltage value is applied to the first unselected adjacent word line, and the control circuit writes data to the selected cells in accordance with the read first (k−1)-level data and the first k-level data to be written.

17. A semiconductor memory control method comprising:
writing first (k−1)-level (k is an integer of 2 or more) data to a first memory cell selected among a plurality of memory cells in at least one memory cell unit, one end of the memory cell unit being connected to a source line, the other end of the memory cell unit being connected to a bit line, the first memory cell having a gate connected to a first word line, and the first word line being adjacent to a second word line on the source line side;
writing second (k−1)-level data to a second memory cell in the at least one memory cell unit, the second memory cell having a gate connected to the second word line;
writing first k-level data to the first memory cell;
writing third (k−1)-level data to a third memory cell in the at least one memory cell unit, the third memory cell having a gate connected to a third word line, and the third word line being adjacent to the second word line on the bit line side;
reading the first (k−1)-level data and the first k-level data in the first memory cell and the third (k−1)-level data in the third memory cell;
applying a first unselect voltage corrected in accordance with a result of the data reading in the first memory cell to the first word line, applying a second unselect voltage corrected in accordance with a result of the data reading in the third memory cell to the third word line, and applying a read voltage to the second word line to read the second (k−1)-level data from the second memory cell; and
writing data to the second memory cell in accordance with the read second (k−1)-level data and second k-level data to be written,
wherein:
the first unselect voltage includes a first voltage value and a second voltage value and the second unselect voltage includes a third voltage value and a fourth voltage value, and
during the reading of the second (k−1)-level data, the third and fourth voltage values are applied to the third word line while the first voltage value is applied to the first word line, and the third and fourth voltage values are applied to the third word line while the second voltage value is applied to the first word line.

* * * * *